(12) United States Patent
Tanaka

(10) Patent No.: US 12,125,939 B2
(45) Date of Patent: Oct. 22, 2024

(54) METHOD OF MANUFACTURING LIGHT-EMITTING DEVICE AND LIGHT-EMITTING DEVICE

(71) Applicant: NICHIA CORPORATION, Anan (JP)

(72) Inventor: Hidetoshi Tanaka, Anan (JP)

(73) Assignee: NICHIA CORPORATION, Anan (JP)

( * ) Notice: Subject to any disclaimer, the term of this patent is extended or adjusted under 35 U.S.C. 154(b) by 360 days.

(21) Appl. No.: 17/078,839

(22) Filed: Oct. 23, 2020

(65) Prior Publication Data

US 2021/0135045 A1    May 6, 2021

(30) Foreign Application Priority Data

Oct. 30, 2019  (JP) .................................. 2019-197184

(51) Int. Cl.
*H01L 33/00*   (2010.01)
*H01L 33/50*   (2010.01)
*H01L 33/52*   (2010.01)

(52) U.S. Cl.
CPC ........ *H01L 33/0093* (2020.05); *H01L 33/504* (2013.01); *H01L 33/52* (2013.01); *H01L 2933/0041* (2013.01); *H01L 2933/005* (2013.01); *H01L 2933/0058* (2013.01); *H01L 2933/0066* (2013.01)

(58) Field of Classification Search
CPC .................................................. H01L 33/0093
USPC ........................................................ 257/79
See application file for complete search history.

(56) References Cited

U.S. PATENT DOCUMENTS

| 2013/0187184 | A1 | 7/2013 | Camras et al. |
| 2013/0248910 | A1 | 9/2013 | Kimura et al. |
| 2017/0294479 | A1* | 10/2017 | Cha ................... H01L 25/0655 |
| 2018/0358339 | A1 | 12/2018 | Iguchi |

(Continued)

FOREIGN PATENT DOCUMENTS

| JP | 2013-201273 A | 10/2013 |
| JP | 2013-539229 A | 10/2013 |

(Continued)

OTHER PUBLICATIONS

Machine translation of Masaki et al., JP 2015012143 A (Year: 2015).*

*Primary Examiner* — Hsin Yi Hsieh
(74) *Attorney, Agent, or Firm* — Foley & Lardner LLP

(57) ABSTRACT

A method of manufacturing a light-emitting device includes providing a structure body including a silicon substrate having a first portion, a second portion, and a third portion between the first portion and the second portion, and a first semiconductor layered body including a first light-emitting layer, the first semiconductor layered body being disposed on or above the silicon substrate. The method includes forming a first resin layer covering a lateral side of the silicon substrate and a lateral side of the first semiconductor layered body. The method includes a removal step of removing the first portion to expose a first surface of the first semiconductor layered body, removing the second portion to expose a second surface of the first semiconductor layered body, and leaving the third portion. The method includes forming a first wavelength conversion member on or above the first surface exposed by the removal of the first portion.

9 Claims, 25 Drawing Sheets

(56) References Cited

U.S. PATENT DOCUMENTS

2019/0326349 A1* 10/2019 Kwon ................. H01L 33/0093
2019/0371779 A1* 12/2019 Yeon ....................... H01L 25/18
2021/0126045 A1*  4/2021 Yeon ....................... H01L 25/18

FOREIGN PATENT DOCUMENTS

| JP | 2015-012143 A | 1/2015 |
| JP | 2016-001750 A | 1/2016 |
| WO | WO-2017/094461 A1 | 6/2017 |
| WO | WO-2018/235231 A1 | 12/2018 |

* cited by examiner

METHOD OF MANUFACTURING LIGHT-EMITTING DEVICE AND LIGHT-EMITTING DEVICE

CROSS-REFERENCE TO RELATED APPLICATION

This application claims priority to Japanese Patent Application No. 2019-197184, filed on Oct. 30, 2019, the disclosure of which is hereby incorporated by reference in its entirety.

BACKGROUND

1. Field of the Invention

The present disclosure relates to a method of manufacturing a light-emitting device and to a light-emitting device.

2. Description of Related Art

Reduction in loss of light in light-emitting devices is desired (Japanese Unexamined Patent Application Publication No. 2016-1750).

SUMMARY

According to certain embodiments, a method of manufacturing a light-emitting device and a light-emitting device are provided in which loss of light can be reduced.

According to one embodiment, a method of manufacturing a light-emitting device includes a step of providing a structure body that includes a silicon substrate including a first portion, a second portion, and a third portion between the first portion and the second portion, and that includes a first semiconductor layered body including a first light-emitting layer, the first semiconductor layered body being disposed on or above the silicon substrate. The manufacturing method includes a step of forming a first resin layer covering a lateral side of the silicon substrate and a lateral side of the first semiconductor layered body. The manufacturing method includes a removal step of removing the first portion to expose a first surface of the first semiconductor layered body, removing the second portion to expose a second surface of the first semiconductor layered body, and leaving the third portion. The manufacturing method includes a step of forming a first wavelength conversion member on or above the first surface exposed by the removal of the first portion.

According to another embodiment, a method of manufacturing a light-emitting device includes a step of providing a structure body that includes a silicon substrate including a first portion and a second portion, and that includes a first semiconductor layered body including a first light-emitting layer, the first semiconductor layered body being disposed on or above the silicon substrate. The manufacturing method includes a step of forming a first resin layer covering lateral sides of the silicon substrate and the first semiconductor layered body. The manufacturing method includes a step of exposing a first surface of the first semiconductor layered body by removing the first portion of the silicon substrate. The manufacturing method includes a step of forming a first wavelength conversion member on or above the first surface exposed by the removal of the first portion. The manufacturing method includes a step of exposing a second surface of the first semiconductor layered body by removing the second portion after the step of forming a first wavelength conversion member.

According to another embodiment, a light-emitting device includes a semiconductor layered body, a first wavelength conversion member, a second wavelength conversion member, and a resin layer. The semiconductor layered body includes a light-emitting layer. A surface of the semiconductor layered body includes a first surface, a second surface, and a third surface between the first surface and the second surface. The first wavelength conversion member is disposed on or above the first surface and is capable of emitting light with a first peak wavelength. The second wavelength conversion member is disposed on or above the second surface and is capable of emitting light with a second peak wavelength different from the first peak wavelength. The resin layer covers a lateral side of the semiconductor layered body, a lateral side of the first wavelength conversion member, and a lateral side of the second wavelength conversion member. A surface roughness of the third surface is less than a surface roughness of the first surface and a surface roughness of the second surface.

Certain embodiments of the present invention provide a method of manufacturing a light-emitting device and a light-emitting device in which loss of light can be reduced.

DETAILED DESCRIPTION

Figure 1:
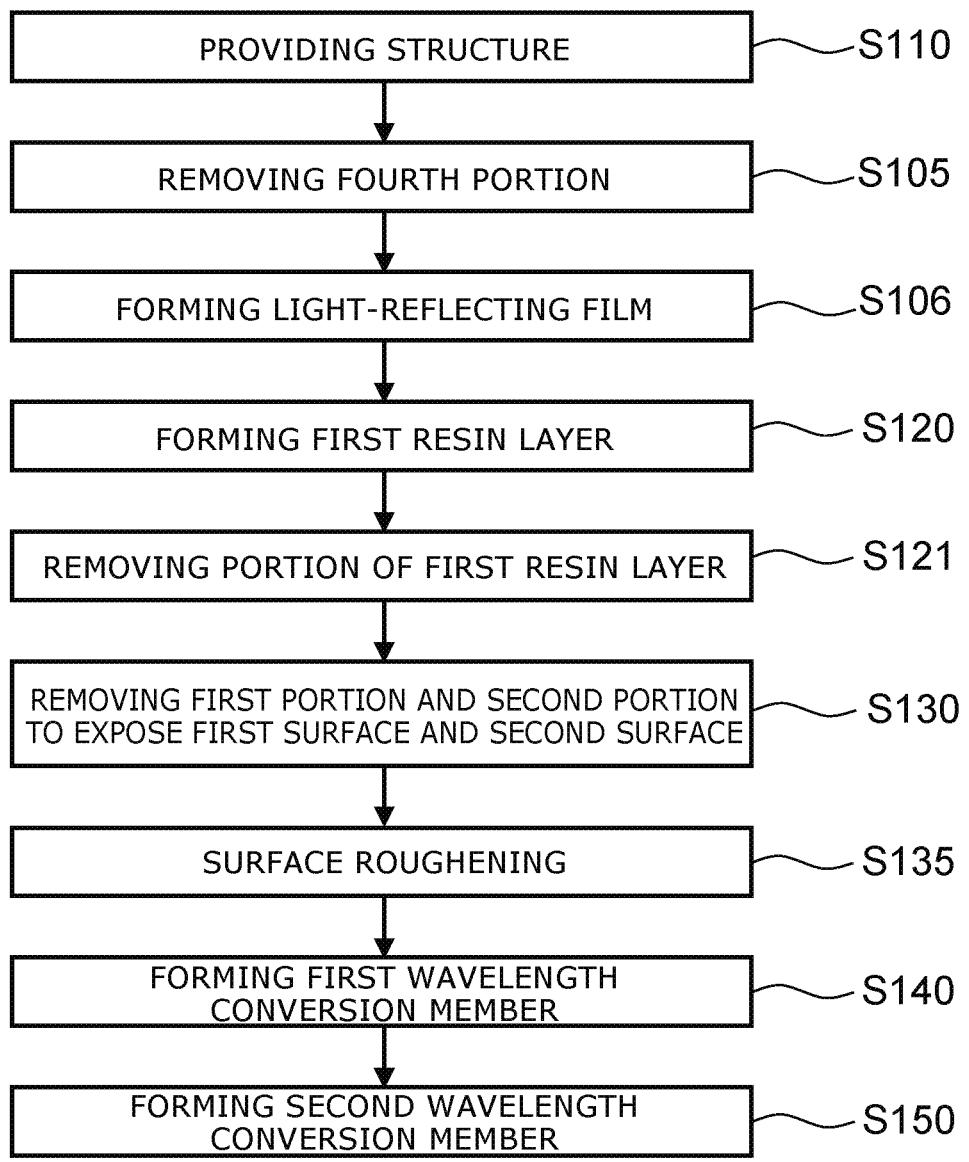
FIG. 1 is a flowchart of an illustrative method of manufacturing a light-emitting device according to a first embodiment.

Certain embodiments of the present invention will be described below with reference to the accompanying drawings.

The drawings are schematic or conceptual, and the relationship between a thickness and a width of each component, the ratio between sizes of the components, and other relationships shown in the drawings are not necessarily the same as those of an actual product. Also, the lengths and ratios of the same component in different drawings may be different from each other. In the specification of the present application, an element that is the same as that described in a drawing that has been previously referred to is indicated with the same reference numeral, and its repeated detailed description is omitted as appropriate.

First Embodiment

FIG. 1 is a flowchart of an illustrative method of manufacturing a light-emitting device according to a first embodiment.

FIG. 2 to FIG. 6 are schematic cross-sectional views showing the illustrative method of manufacturing a light-emitting device according to the first embodiment.

Figure 2:
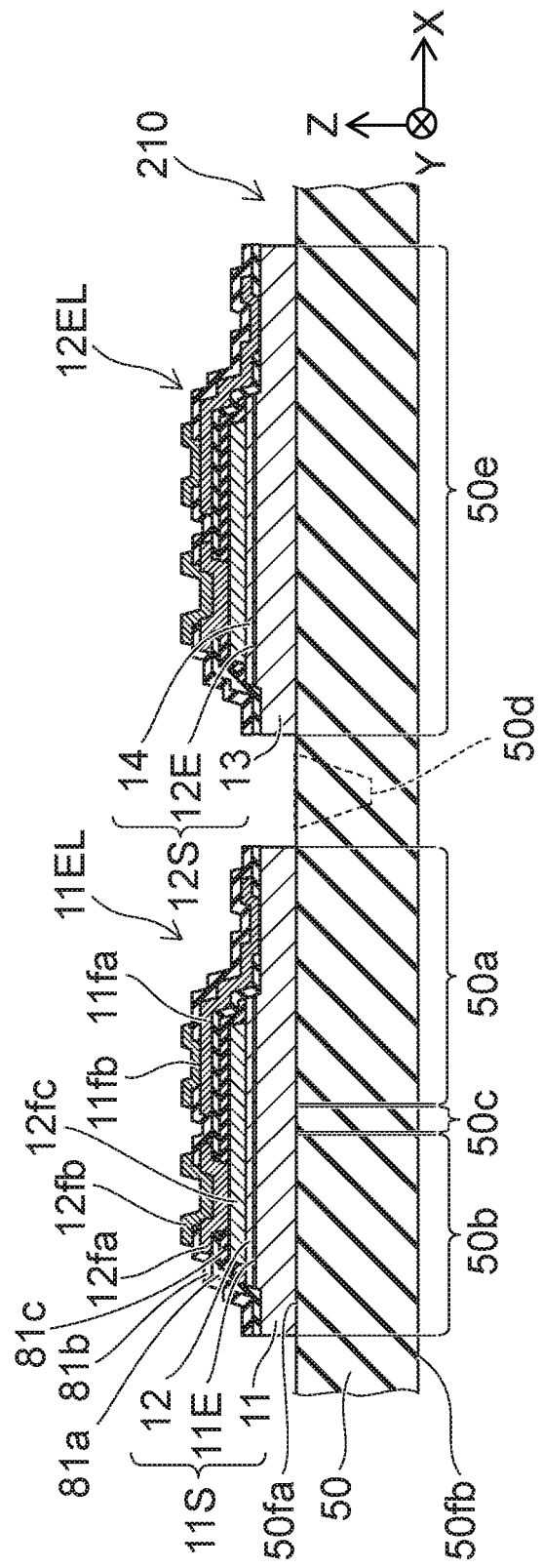
FIG. 2 is a schematic cross-sectional view showing the illustrative method of manufacturing a light-emitting device according to the first embodiment.

A structure body 210 is provided (Step S110) as shown in FIG. 1 and FIG. 2. The structure body 210 includes a silicon substrate 50 and a first semiconductor layered body 11S as shown in FIG. 2. In this example, the structure body 210 further includes a second semiconductor layered body 12S.

For example, the first semiconductor layered body 11S and the second semiconductor layered body 12S are disposed on the silicon substrate 50. For example, crystal growth is performed on the silicon substrate 50 to form the first semiconductor layered body 11S and the second semiconductor layered body 12S. Semiconductor crystals obtained by the crystal growth constitute the first semiconductor layered body 11S and the second semiconductor layered body 12S.

The first semiconductor layered body 11S includes, for example, a first semiconductor layer 11, a second semiconductor layer 12, and a first light-emitting layer 11E. A portion of the first semiconductor layer 11 is disposed between a portion of the silicon substrate 50 and the second semiconductor layer 12. The first light-emitting layer 11E is disposed between the first semiconductor layer 11 and the second semiconductor layer 12.

The second semiconductor layered body 12S includes, for example, a third semiconductor layer 13, a fourth semiconductor layer 14, and a second light-emitting layer 12E. A portion of the third semiconductor layer 13 is disposed between the fourth semiconductor layer 14 and a portion of the silicon substrate 50 other than the portion provided with the first semiconductor layered body 11S. The second light-emitting layer 12E is disposed between the third semiconductor layer 13 and the fourth semiconductor layer 14.

The first semiconductor layer 11 and the third semiconductor layer 13 are made of, for example, an n-type semiconductor. The second semiconductor layer 12 and the fourth semiconductor layer 14 are made of, for example, a p-type semiconductor.

The first semiconductor layer 11, the second semiconductor layer 12, the third semiconductor layer 13, the fourth semiconductor layer 14, the first light-emitting layer 11E, and the second light-emitting layer 12E each contain, for example, a nitride semiconductor.

For example, a first light-emitting unit 11EL includes the first semiconductor layer 11, the second semiconductor layer 12, and the first light-emitting layer 11E. For example, a second light-emitting unit 12EL includes the third semiconductor layer 13, the fourth semiconductor layer 14, and the second light-emitting layer 12E. A plurality of light-emitting units may be disposed on the silicon substrate 50 as described above. The first light-emitting unit 11EL will be described below as an example of the light-emitting units.

The direction perpendicular to the silicon substrate 50 is referred to as a Z-axis direction. An axis perpendicular to the Z-axis direction is referred to as an X-axis direction. The direction perpendicular to the Z-axis direction and the X-axis direction is referred to as a Y-axis direction.

As for the first semiconductor layered body 11S, the first semiconductor layer 11, the first light-emitting layer 11E, and the second semiconductor layer 12 are layered in the Z-axis direction. The first semiconductor layer 11, the first light-emitting layer 11E, and the second semiconductor layer 12 are substantially parallel to the X-Y plane. The direction from the first semiconductor layered body 11S to the second semiconductor layered body 12S lies along the X-Y plane.

The silicon substrate 50 includes a first portion 50a, a second portion 50b, and a third portion 50c as shown in FIG. 2. The direction from the second portion 50b to the first portion 50a lies along the X-Y plane. The third portion 50c is located between the first portion 50a and the second portion 50b. For example, the third portion 50c is like a partition between the first portion 50a and the second portion 50b.

The direction from the first portion 50a to the first semiconductor layered body 11S, the direction from the second portion 50b to the first semiconductor layered body 11S, and the direction from the third portion 50c to the first semiconductor layered body 11S lie along the Z-axis direction. For example, the first semiconductor layered body 11S is disposed over the first portion 50a, the second portion 50b, and the third portion 50c.

For example, the silicon substrate 50 has a first substrate surface 50fa and a second substrate surface 50fb. In the Z-axis direction, the first substrate surface 50fa is located between the second substrate surface 50fb and the first semiconductor layered body 11S. The first substrate surface 50fa faces the first semiconductor layered body 11S. The first substrate surface 50fa and the second substrate surface 50fb lie along, for example, the X-Y plane. The first substrate surface 50fa is, for example, the upper surface of the silicon substrate 50. The second substrate surface 50fb is, for example, the lower surface of the silicon substrate 50.

For example, the first portion 50a may have a portion of the first substrate surface 50fa. The second portion 50b has another portion of the first substrate surface 50fa other than the portion of the first substrate surface 50fa belonging to the first portion 50a. The third portion 50c has another portion of the first substrate surface 50fa other than the portions of the first substrate surface 50fa belonging to the first portion 50a and the second portion 50b.

The silicon substrate 50 includes a portion (the first portion 50a, the second portion 50b, and the third portion 50c) facing the first light-emitting unit 11EL and a portion facing the second light-emitting unit 12EL as shown in FIG. 2. The silicon substrate 50 may include a portion (such as a fourth portion 50d) between the portion facing the first light-emitting unit 11EL and the portion facing the second light-emitting unit 12EL. The fourth portion 50d corresponds to the region between the light-emitting units.

The structure body 210 may include electrically-conductive films 11fa, 11fb, 12fa, 12fb, and 12fc as shown in FIG. 2. For example, a portion of the electrically-conductive film 11fa is in contact with the first semiconductor layer 11. The electrically-conductive film 11fb is disposed on another portion of the electrically-conductive film 11fa. For example, the electrically-conductive film 12fa is in contact with the electrically-conductive film 12fc. The electrically-conductive film 12fc is in contact with the second semiconductor layer 12 and has the function of, for example, reflecting a portion of light emitted from the first light-emitting layer 11E. The electrically-conductive film 12fb is disposed on the electrically-conductive film 12fa.

The structure body 210 may include insulating films 81a, 81b, and 81c as shown in FIG. 2. The insulating film 81a covers a portion of the insulating film 81c and a portion of the first semiconductor layered body 11S and functions as an interlayer insulating film. The insulating film 81b covers a portion of the insulating film 81a and a portion of the electrically-conductive film 12fa and functions as a protective film. The insulating film 81c covers a portion of the electrically-conductive film 12fc and a portion of the second semiconductor layer 12 and has a function of, for example, inhibiting migration of the electrically-conductive film 12fc.

Figure 3:
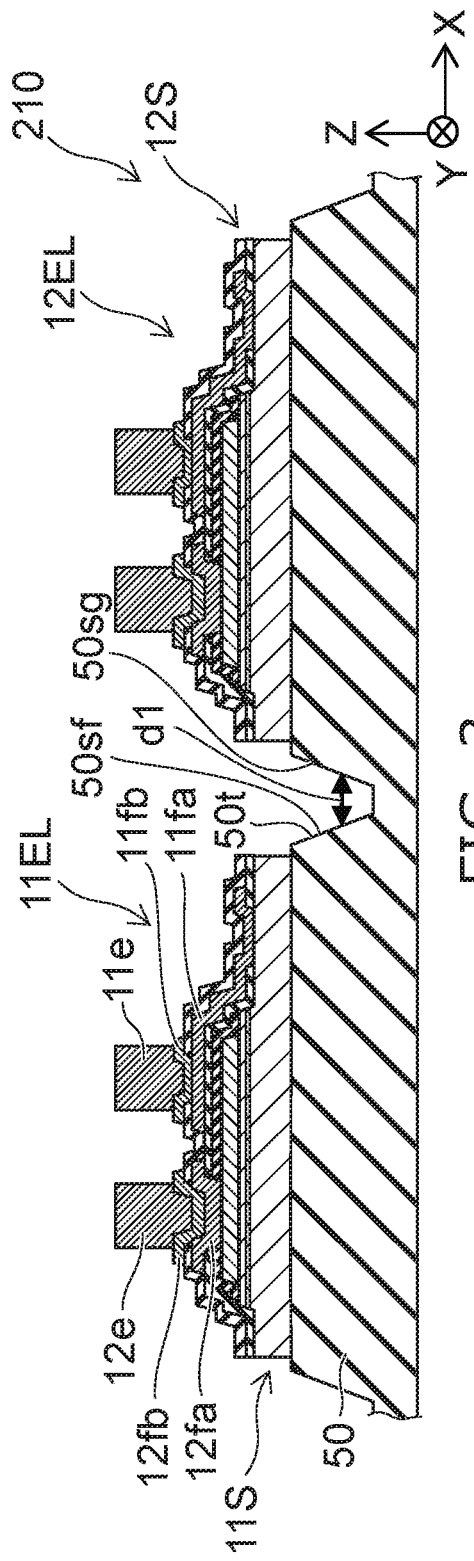
FIG. 3 is a schematic cross-sectional view showing the illustrative method of manufacturing a light-emitting device according to the first embodiment.

In the manufacturing method according to the present embodiment, the fourth portion 50d may be removed (Step S105) as shown in FIG. 1 and FIG. 3. For example, the fourth portion 50d may be removed by cutting with a blade, wet etching, or dry etching. A trench 50t is made in the silicon substrate 50 by removing the fourth portion 50d as shown in FIG. 3. A lateral surface 50sf of the silicon substrate 50 is exposed in the trench 50t. The lateral surface 50sf of the silicon substrate 50 intersects with the X-Y plane. In the case in which the fourth portion 50d is removed using a blade, the trench 50t is formed in a shape corresponding to the shape of the blade, which allows the shape of the trench 50t to be easily controlled. In the case in which the fourth portion 50d is removed by wet etching or dry etching, the lateral surface 50sf is likely to be highly flat. The flatness of a first resin layer 31 in the trench 50t in a step of forming a first resin layer 31 described below is thus enhanced, and extraction of light from the light-emitting device is enhanced.

The structure body 210 may include a first electrically-conductive member 11e as shown in FIG. 3. The first electrically-conductive member 11e is electrically connected to the first semiconductor layered body 11S. In this example, the first electrically-conductive member 11e is electrically connected to the first semiconductor layer 11 through the electrically-conductive films 11fb and 11fa.

The structure body 210 may include a second electrically-conductive member 12e. The second electrically-conductive member 12e is electrically connected to the first semiconductor layered body 11S. In this example, the second electrically-conductive member 12e is disposed on the electrically-conductive film 12fb and electrically connected to the second semiconductor layer 12 through the electrically-conductive films 12fb and 12fa.

The first electrically-conductive member 11e and the second electrically-conductive member 12e function as, for example, electrodes of the first light-emitting unit 11EL. When a voltage is applied between the first electrically-conductive member 11e and the second electrically-conductive member 12e, light is emitted from the first light-emitting layer 11E.

A light-reflecting film may be formed (Step S106) as shown in FIG. 1. For example, a light-reflecting film 61 (see FIG. 4) is formed in a region including the trench 50t after the step shown in FIG. 3. For example, the light-reflecting film 61 includes a plurality of dielectric films layered on top of each other. The refractive index of one of the dielectric films differs from the refractive index of another one of the dielectric films. The light-reflecting film 61 is, for example, a distributed Bragg reflector (DBR). The light-reflecting film 61 can be formed by, for example, sputtering or vapor deposition.

Figure 4:
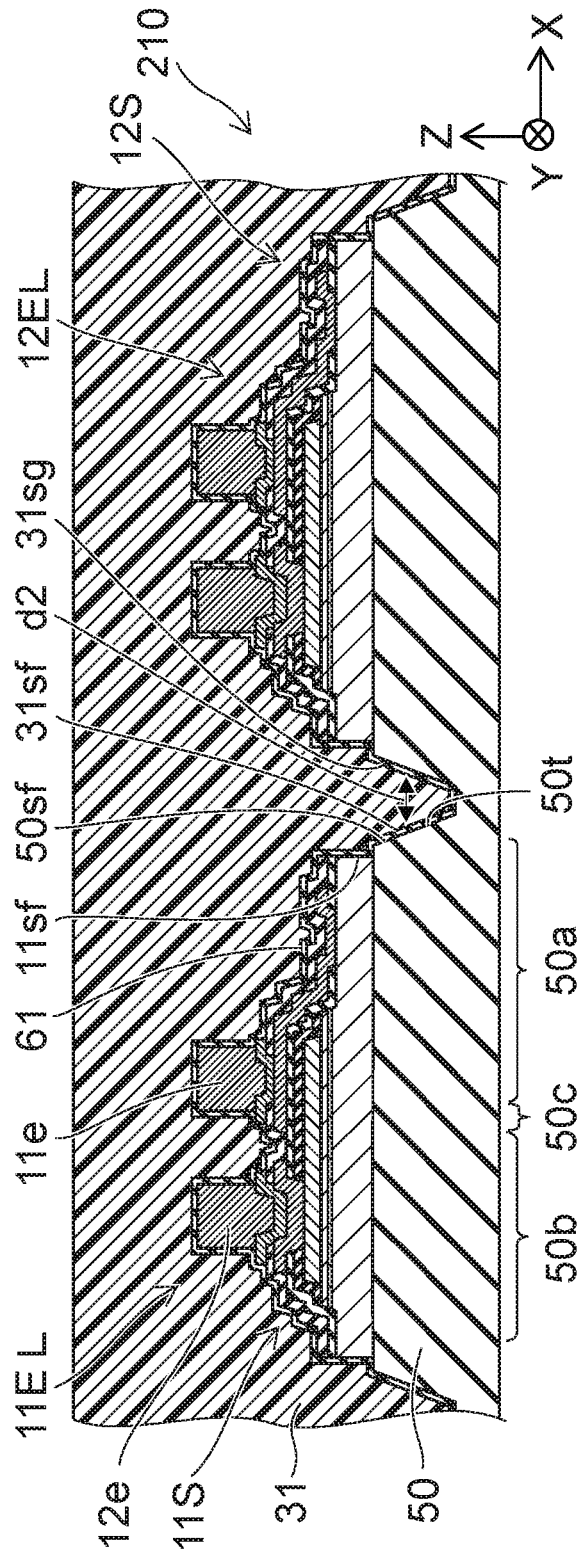
FIG. 4 is a schematic cross-sectional view showing the illustrative method of manufacturing a light-emitting device according to the first embodiment.

In the manufacturing method according to the present embodiment, the first resin layer 31 is formed (Step S120) as shown in FIG. 1 and FIG. 4. The first resin layer 31 is formed to cover a lateral side of the silicon substrate 50 and a lateral side of the first semiconductor layered body 11S.

For example, a portion of the first resin layer 31 is located inside the trench 50t of the silicon substrate 50 as shown in FIG. 4. The direction from the lateral surface 50sf of the silicon substrate 50 to the portion of the first resin layer 31 lies along the X-Y plane. The portion of the first resin layer 31 faces the lateral surface 50sf of the silicon substrate 50.

For example, the first semiconductor layered body 11S has a lateral surface 11sf. The lateral surface 11sf of the first semiconductor layered body 11S intersects with the X-Y plane. A portion of the first resin layer 31 is formed in a region facing the lateral surface 11sf of the first semiconductor layered body 11S. The direction from the lateral surface 11sf of the first semiconductor layered body 11S to the portion of the first resin layer 31 lies along the X-Y plane.

For example, the first resin layer 31 contains at least one selected from the group consisting of silicone resins, acrylic resins, and epoxy resins. The first resin layer 31 can be formed by, for example, application or compression molding.

Figure 5:
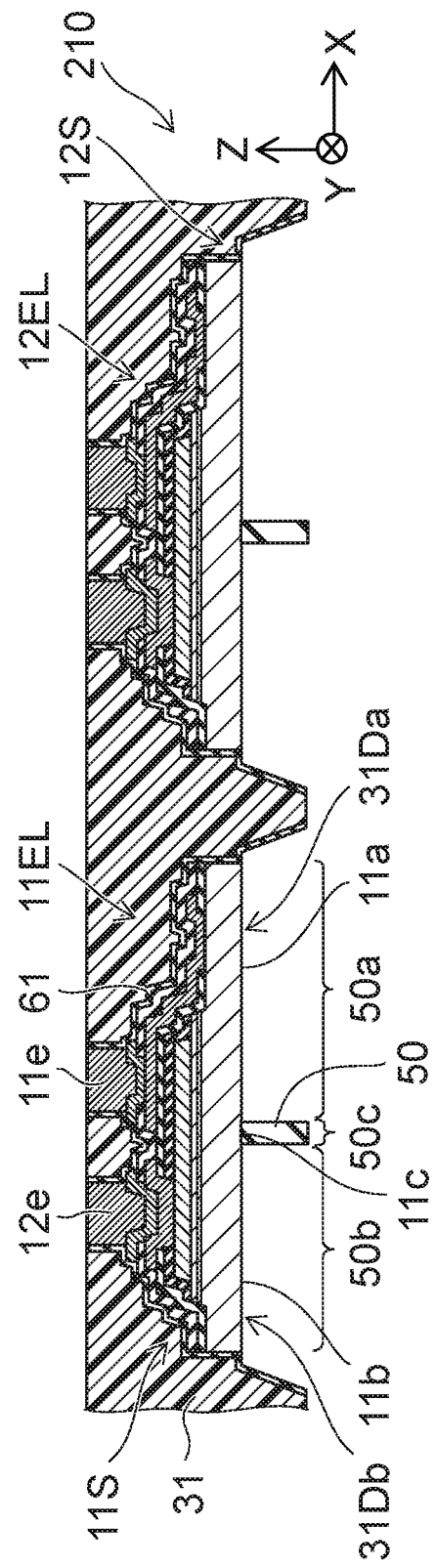
FIG. 5 is a schematic cross-sectional view showing the illustrative method of manufacturing a light-emitting device according to the first embodiment.

In this example, a portion of the first resin layer 31 is removed to expose a portion of the first electrically-conductive member 11e and a portion of the second electrically-conductive member 12e (Step S121) as shown in FIG. 1 and FIG. 5.

The first portion 50a and the second portion 50b of the silicon substrate 50 are removed (Step S130) as shown in FIG. 1 and FIG. 5. The third portion 50c is left at this time. The first portion 50a and the second portion 50b can be removed by, for example, dry etching. In this removal step, for example, the first portion 50a is removed such that a first surface 11a of the first semiconductor layered body 11S is exposed, and the second portion 50b is removed such that a second surface 11b of the first semiconductor layered body 11S is exposed. A third surface 11c of the first semiconductor layered body 11S is not exposed at this time. The above step (Step S121) of removing at least a portion of the first resin layer 31 may be performed before or after the step (Step S130) of removing the first portion 50a.

A first depressed portion 31Da is formed by removing the first portion 50a as shown in FIG. 5. A second depressed portion 31Db is formed by removing the second portion 50b. The first surface 11a corresponds to the bottom surface of the first depressed portion 31Da. The second surface 11b corresponds to the bottom surface of the second depressed portion 31Db. The light-reflecting film 61 is exposed in the first depressed portion 31Da and the second depressed portion 31Db. The first surface 11a corresponds to the surface exposed by removing the first portion 50a. The second surface 11b is the surface exposed by removing the second portion 50b. For example, the third portion 50c is like a partition between the first depressed portion 31Da and the second depressed portion 31Db.

Figure 6:
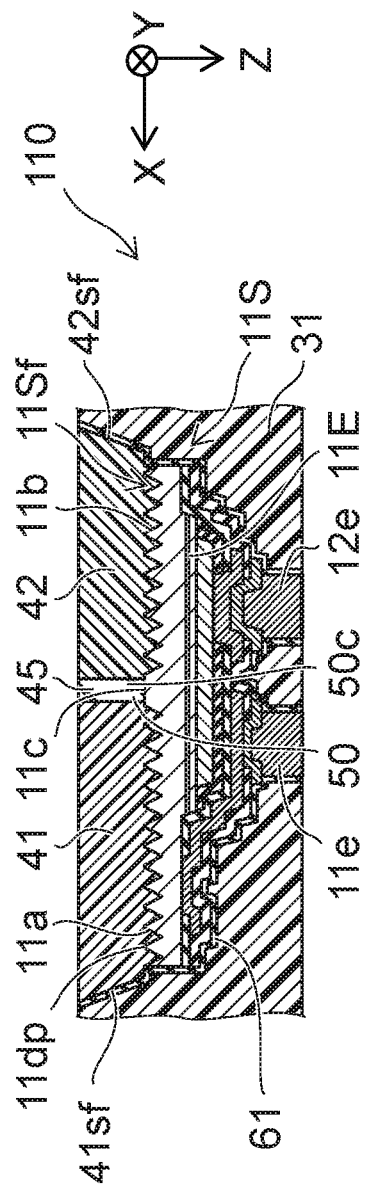
FIG. 6 is a schematic cross-sectional view showing the illustrative method of manufacturing a light-emitting device according to the first embodiment.

A first wavelength conversion member 41 is formed on the first surface 11a (Step S140) as shown in FIG. 1 and FIG. 6. In this example, surface roughening (Step S135) is performed between the removal step (Step S130) and the step (Step S140) of forming the first wavelength conversion member 41. In Step S135, the first surface 11a is roughened. For example, the surface roughness of the first surface 11a is increased by etching (such as wet etching) of the first surface 11a exposed in Step S130.

By roughening the first surface 11a, irregularities 11dp are formed on the first surface 11a as shown in FIG. 6. The second surface 11b may also be roughened at this time. Roughening the first surface 11a enhances the light extraction efficiency.

The first wavelength conversion member 41 is formed (Step S140) on the first surface 11a exposed by removing the first portion 50a as shown in FIG. 6 after Step S130 (after Step S135 in this example). The first wavelength conversion member 41 contains, for example, resin and wavelength conversion particles. Examples of the wavelength conversion particles include phosphors such as YAG phosphors, LAG phosphors, KSF phosphors, CASN phosphors, SCASN phosphors, β-SiAlON phosphors, and chlorosilicate phosphors. Light emitted from the first light-emitting layer 11E enters the first wavelength conversion member 41 and is subjected to wavelength conversion, so that light having a desired color is obtained.

In the present embodiment, the first wavelength conversion member 41 is formed in a space formed by removing the silicon substrate 50. This allows the first wavelength conversion member 41 to be precisely formed, so that the first wavelength conversion member 41 can be efficiently formed.

FIG. 6 schematically shows a portion of the structure body 210 including the first semiconductor layered body 11S. The structure body 210 may be divided into the portion including the first semiconductor layered body 11S and a portion including the second semiconductor layered body 12S before the first wavelength conversion member 41 is formed. The first wavelength conversion member 41 may be formed after the division. Alternatively, the structure body 210 may be divided into the portion including the first semiconductor layered body 11S and the portion including the second semiconductor layered body 12S after the first wavelength conversion member 41 is formed.

A second wavelength conversion member 42 may be formed (Step S150) as shown in FIG. 1 and FIG. 6. In Step S150, the second wavelength conversion member 42 is formed on the second surface 11b formed by removing the second portion 50b as shown in FIG. 6. The second wavelength conversion member 42 contains, for example, resin and wavelength conversion particles. Examples of the wavelength conversion particles include phosphors such as YAG phosphors, LAG phosphors, KSF phosphors, CASN phosphors, SCASN phosphors, β-SiAlON phosphors, and chlorosilicate phosphors. For example, the peak wavelength of light emitted from the second wavelength conversion member 42 differs from the peak wavelength of light emitted from the first wavelength conversion member 41. The color of light emitted from the second wavelength conversion member 42 differs from the color of light emitted from the first wavelength conversion member 41. The light-emitting device 110 is thus obtained.

In the example shown in FIG. 6, the first wavelength conversion member 41 and the second wavelength conversion member 42 are disposed along the X-axis direction. Accordingly, among light emitted from the first light-emitting layer 11E, light passing through the first wavelength conversion member 41 is unlikely to enter the second wavelength conversion member 42 than in the case in which, for example, the first wavelength conversion member 41 and the second wavelength conversion member 42 are disposed along the Z-axis direction. Similarly, among light emitted from the first light-emitting layer 11E, light passing through the second wavelength conversion member 42 is unlikely to enter the first wavelength conversion member 41 than in the case in which the first wavelength conversion member 41 and the second wavelength conversion member 42 are disposed along the Z-axis direction.

For example, if light that has passed through one wavelength conversion member enters the other wavelength conversion member, the light conversion efficiency decreases. For example, if light emitted from the first light-emitting layer 11E enters a wavelength conversion member that performs conversion into short wavelengths before entering another wavelength conversion member that performs conversion into long wavelengths, light that has been converted into light with short wavelengths is absorbed by the other wavelength conversion member, which causes loss of light.

In the present embodiment, among light emitted from the first light-emitting layer 11E, light passing through the first wavelength conversion member 41 is unlikely to enter the second wavelength conversion member 42, and light passing through the second wavelength conversion member 42 is unlikely to enter the first wavelength conversion member 41 as described above. This allows for reducing loss of light emitted from the first light-emitting layer 11E. Accordingly, a method of manufacturing a light-emitting device and a light-emitting device in which loss of light can be reduced are provided.

As has already been described, the fourth portion 50d is removed (Step S105) before the step (Step S120) of forming the first resin layer 31 in the manufacturing method in this example. In Step S105, the fourth portion 50d of the silicon substrate 50 is removed from the side of the first semiconductor layered body 11S provided on the silicon substrate 50. The structure body 210 further includes the second semiconductor layered body 12S including the second light-emitting layer 12E as shown in FIG. 3. The fourth portion 50d is located between the first semiconductor layered body 11S and the second semiconductor layered body 12S in a first direction (such as the X-axis direction) from the first semiconductor layered body 11S to the second semiconductor layered body 12S.

The silicon substrate 50 further includes a fifth portion 50e. The fifth portion 50e faces the second semiconductor layered body 12S in the Z-axis direction. The direction from the fifth portion 50e to the second semiconductor layered body 12S lies along the Z-axis direction. The fourth portion 50d is located between the portion including the first portion 50a, the second portion 50b, and the third portion 50c and the fifth portion 50e.

The step (Step S120) of forming the first resin layer 31 includes forming a portion of the first resin layer 31 in a region (such as the trench 50t) formed in the step of removing the fourth portion 50d as shown in FIG. 4.

In the step (Step S105) of removing the fourth portion 50d, two lateral surfaces (the lateral surface 50sf and a lateral surface 50sg) of the silicon substrate 50 are exposed as shown in FIG. 3. The lateral surface 50sf and the lateral surface 50sg intersect with the X-Y plane. The lateral surface 50sf and the lateral surface 50sg face each other in the first direction (the X-axis direction). As described above, the two lateral surfaces of the silicon substrate 50 are formed in the step (Step S105) of removing the fourth portion 50d. By inclining the lateral surface 50sf and the lateral surface 50sg of the silicon substrate with respect to the Z-axis direction as shown in FIG. 3, a distance d1 between the lateral surfaces in the first direction (the X-axis direction) may be increased along the direction from the silicon substrate 50 to the first semiconductor layered body 11S.

For example, the first resin layer 31 is formed inside the trench 50t in the step (Step S120) of forming the first resin layer 31 as shown in FIG. 4. A distance d2 between two lateral surfaces (lateral surfaces) of the first resin layer 31 formed inside the trench 50t in the first direction (the X-axis direction) increases along the direction from the silicon substrate 50 to the first semiconductor layered body 11S.

In this example, the light-reflecting film 61 is formed (Step S106) between the step (Step S105) of removing the fourth portion 50d and the step (Step S120) of forming the first resin layer 31 as shown in FIG. 1. In Step S106, the light-reflecting film 61 is formed on the lateral surfaces (the lateral surface 50sf and the lateral surface 50sg) of the silicon substrate 50 formed in the step of removing the fourth portion 50d (see FIG. 4).

The light-reflecting film 61 may be left when the first portion 50a and the second portion 50b of the silicon substrate 50 are removed as shown in FIG. 5. The light-reflecting film 61 is located between the first wavelength conversion member 41 and the first resin layer 31 as shown in FIG. 6. The light-reflecting film 61 is located between the second wavelength conversion member 42 and the first resin layer 31. With the light-reflecting film 61 at which light emitted from the light-emitting layer is reflected, high light extraction efficiency can be obtained.

For example, a lateral surface 41sf of the first wavelength conversion member 41 is inclined with respect to the Z-axis direction as shown in FIG. 6. A lateral surface 42sf of the second wavelength conversion member 42 is inclined with respect to the Z-axis direction. With the inclined lateral surfaces, high light extraction efficiency can be obtained. The angle defined by the X-Y plane and the lateral surface 41sf is less than 90°. The angle defined by the X-Y plane and the lateral surface 42sf is less than 90°.

Figure 7:
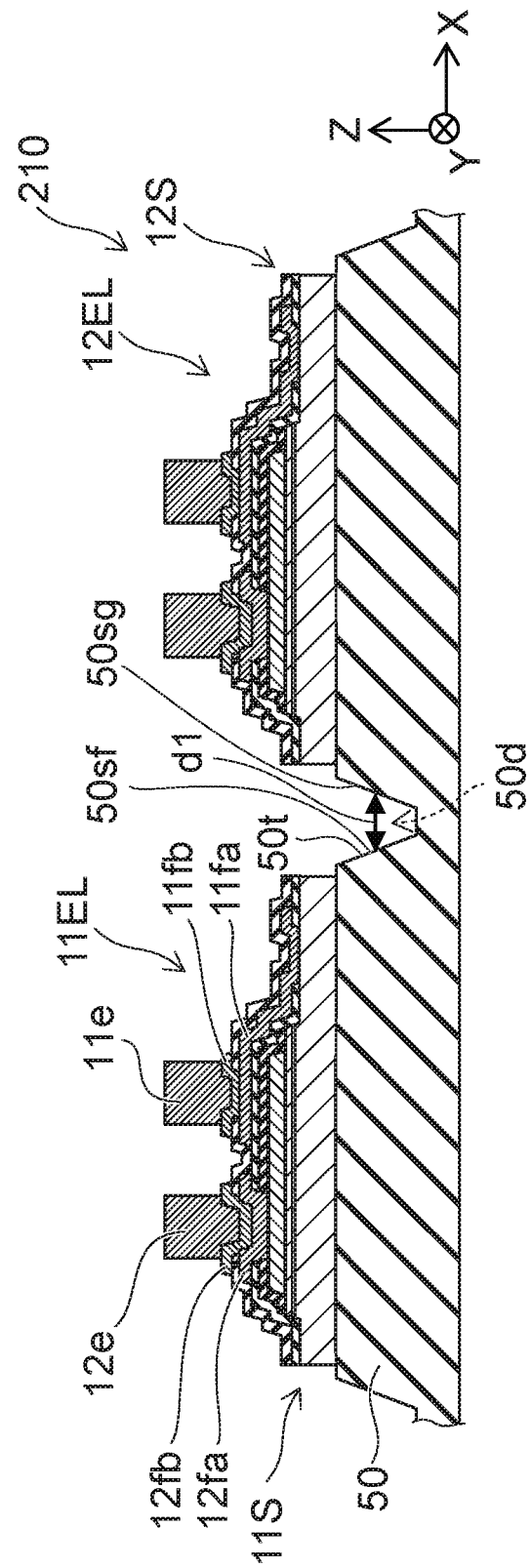
FIG. 7 is a schematic cross-sectional view showing the illustrative method of manufacturing a light-emitting device according to the first embodiment.
Figure 8:
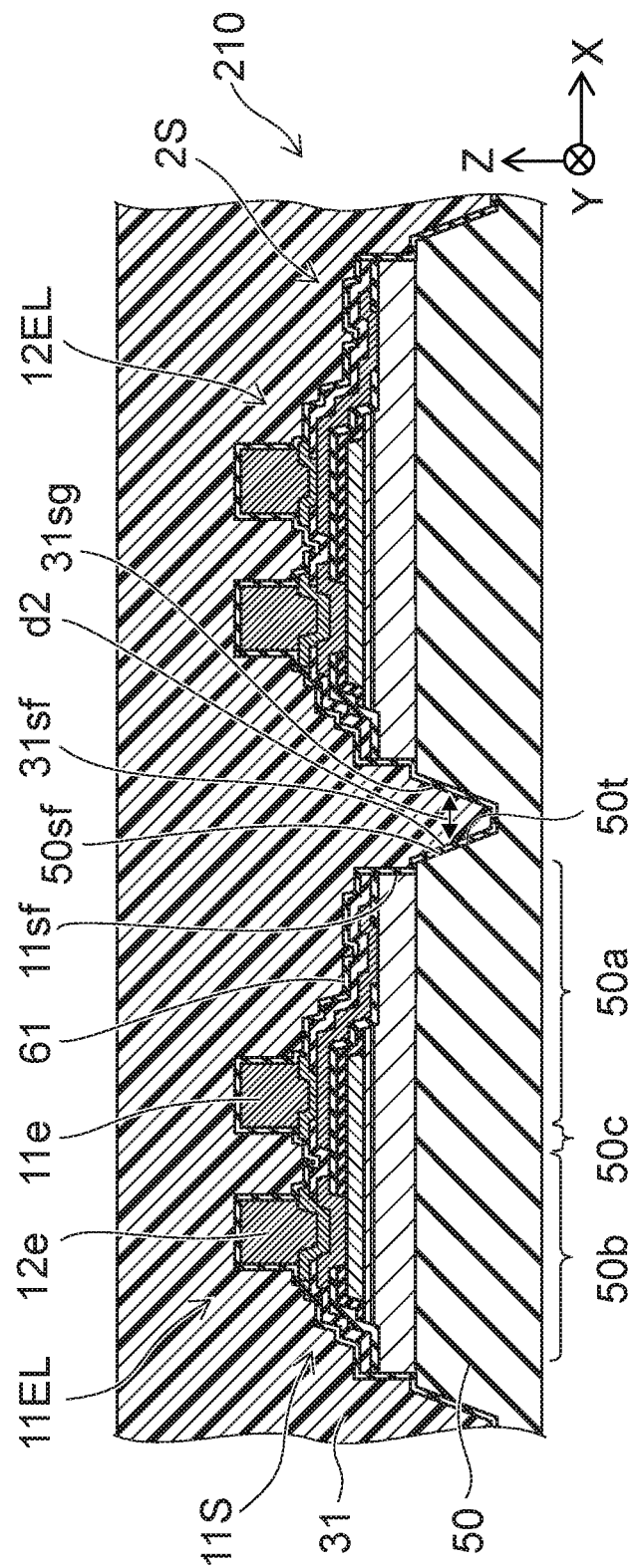
FIG. 8 is a schematic cross-sectional view showing the illustrative method of manufacturing a light-emitting device according to the first embodiment.
Figure 9:
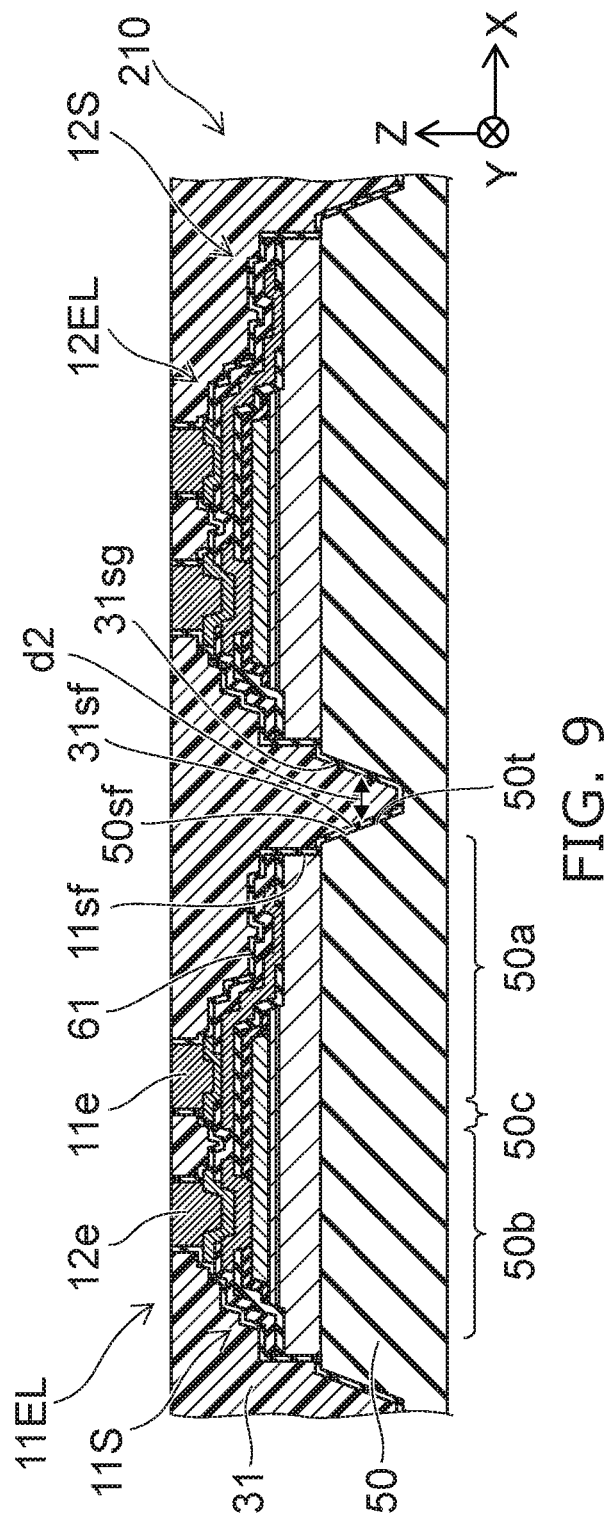
FIG. 9 is a schematic cross-sectional view showing the illustrative method of manufacturing a light-emitting device according to the first embodiment.

FIG. 7 to FIG. 9 are schematic cross-sectional views showing the illustrative method of manufacturing a light-emitting device according to the first embodiment.

As has already been described, the fourth portion 50d, which is the portion of the silicon substrate 50 between the portion facing the first light-emitting unit 11EL and the portion facing the second light-emitting unit 12EL, is removed (Step S105) from the side of the first semiconductor layered body 11S provided on the silicon substrate 50 as shown in FIG. 7 before the step (Step S120) of forming the first resin layer 31. As has already been described, the first resin layer 31 is formed to cover the lateral side of the silicon substrate 50 and the lateral side of the first semiconductor layered body 11S (Step S120) as shown in FIG. 8.

The step (Step S121) of removing a portion of the first resin layer 31 includes exposing from the first resin layer 31 a portion of the first electrically-conductive member 11e electrically connected to the first semiconductor layered body 11S as shown in FIG. 9. The step of removing a portion of the first resin layer 31 may include exposing from the first resin layer 31 a portion of the second electrically-conductive member 12e electrically connected to the first semiconductor layered body 11S.

Figure 10:
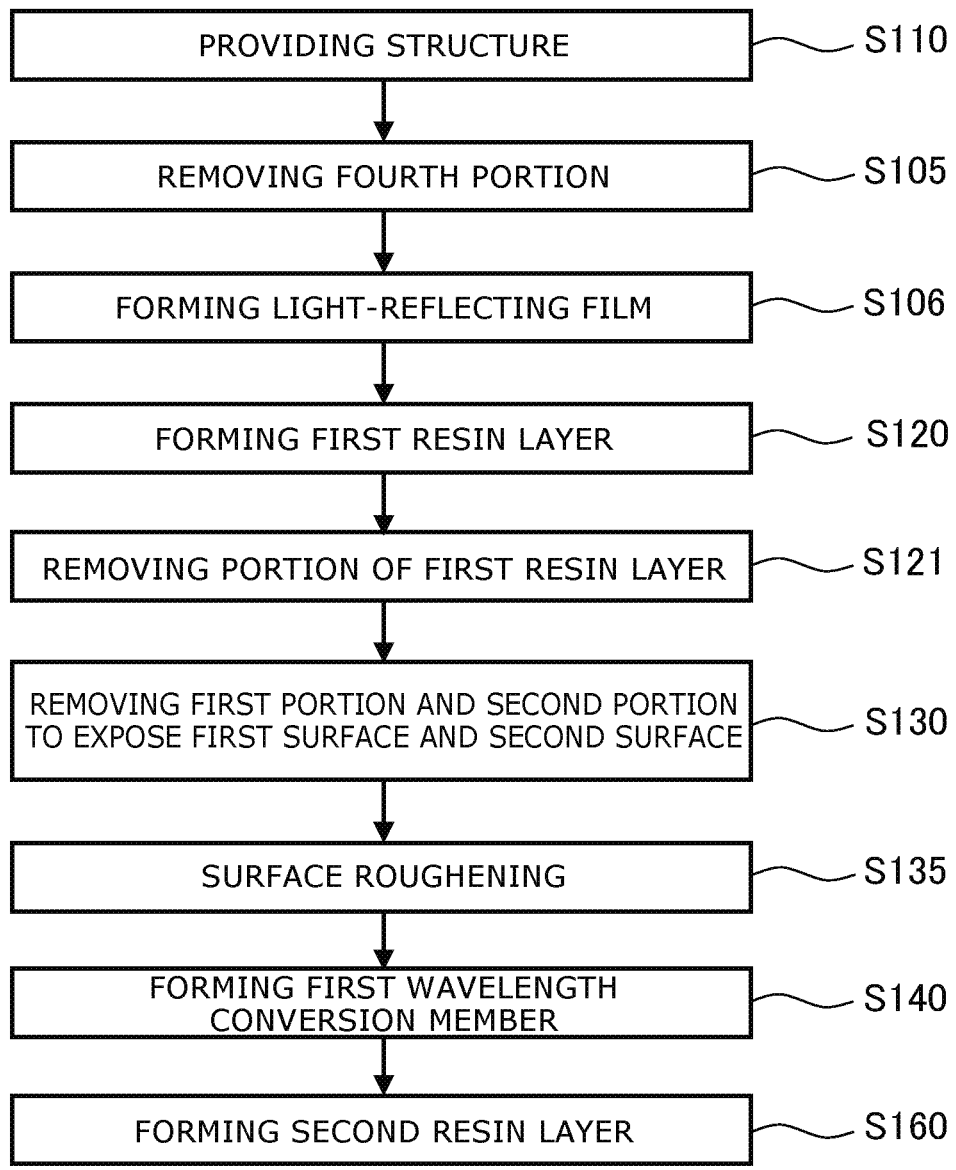
FIG. 10 is a flowchart of an illustrative method of manufacturing a light-emitting device according to the first embodiment.

FIG. 10 is a flowchart of an illustrative method of manufacturing a light-emitting device according to the first embodiment.

Figure 11:
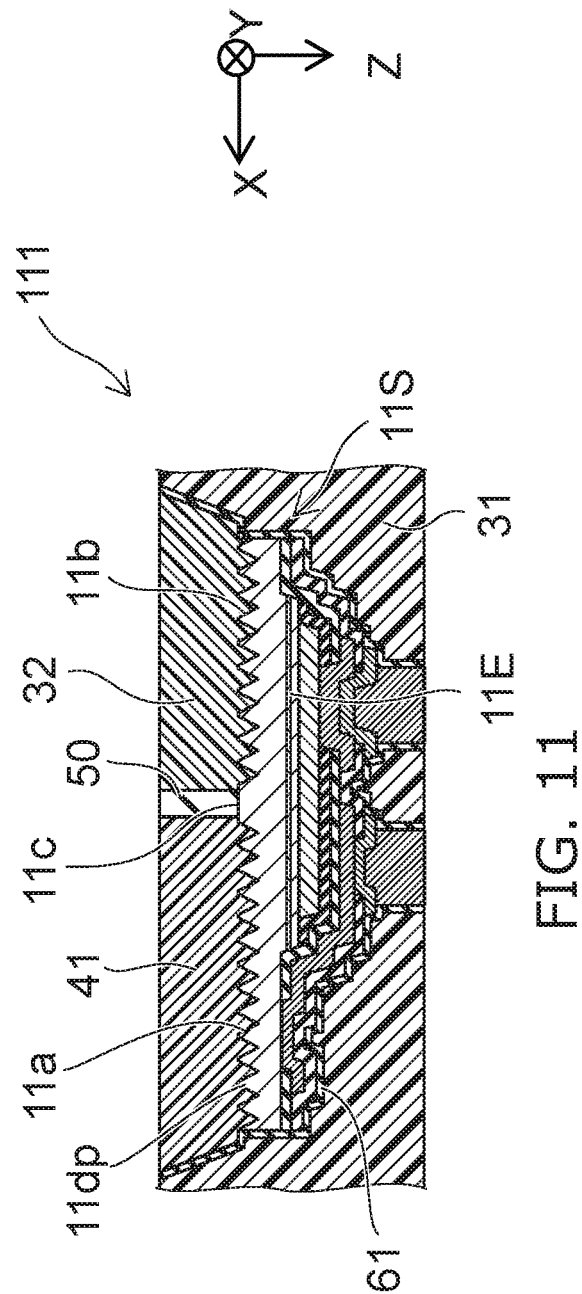
FIG. 11 is a schematic cross-sectional view showing the illustrative method of manufacturing a light-emitting device according to the first embodiment.

FIG. 11 is a schematic cross-sectional view showing the illustrative method of manufacturing a light-emitting device according to the first embodiment.

The method of manufacturing a light-emitting device according to the present embodiment includes Steps S110, S105, S106, S120, S121, S130, S135, and S140 described referring to FIG. 1 and Step S160 as shown in FIG. 10. In Step S160, a second resin layer 32 is formed on the second surface 11b. A light-emitting device 111 shown in FIG. 11 is thus obtained. Also in the light-emitting device 111, the first portion 50a and the second portion 50b of the silicon substrate 50 are removed, so that absorption of light is reduced. Accordingly, a method of manufacturing a light-emitting device and a light-emitting device in which loss of light can be reduced are provided.

In an example, the second resin layer 32 transmits light and contains no wavelength conversion member. The light transmittance of the second resin layer 32 is higher than the light transmittance of the silicon substrate 50. For example, the second resin layer 32 protects the second surface 11b.

In an example, the second resin layer 32 has the function of reflecting light. For example, the light reflectance of the second resin layer 32 is higher than the light reflectance of the silicon substrate 50.

In the light-emitting device 111 in which the second resin layer 32 transmits light, a portion of light emitted from the first light-emitting layer 11E passes through the first wavelength conversion member 41 to get its wavelengths converted, and another portion of the light emitted from the first light-emitting layer 11E passes through the second resin layer 32 with its wavelengths unconverted. This allows for reducing loss of light emitted from the first light-emitting layer 11E. Accordingly, a method of manufacturing a light-emitting device and a light-emitting device in which loss of light can be reduced are provided.

Figure 12:
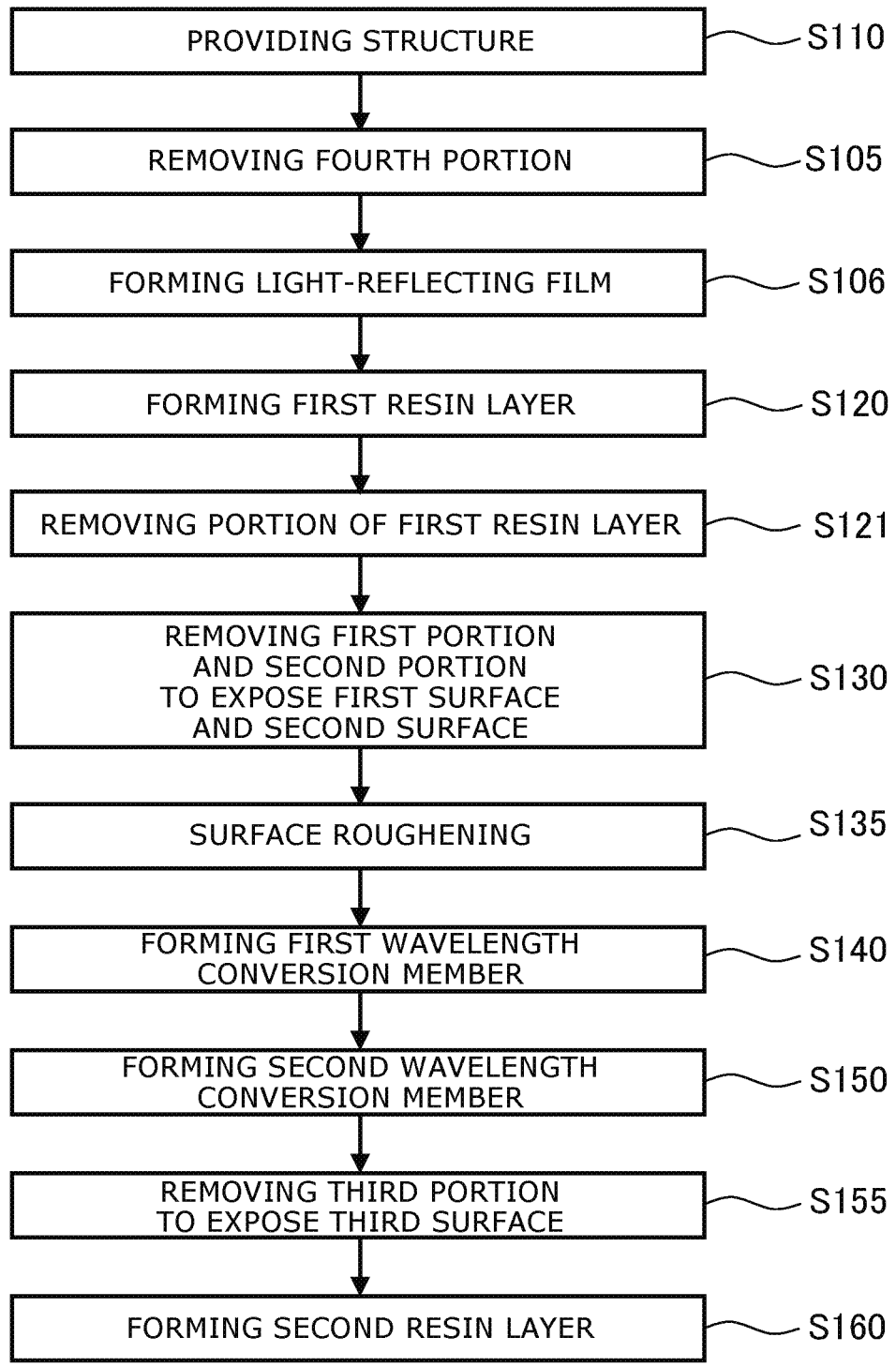
FIG. 12 is a flowchart of an illustrative method of manufacturing a light-emitting device according to the first embodiment.

FIG. 12 is a flowchart of an illustrative method of manufacturing a light-emitting device according to the first embodiment.

Figure 13:
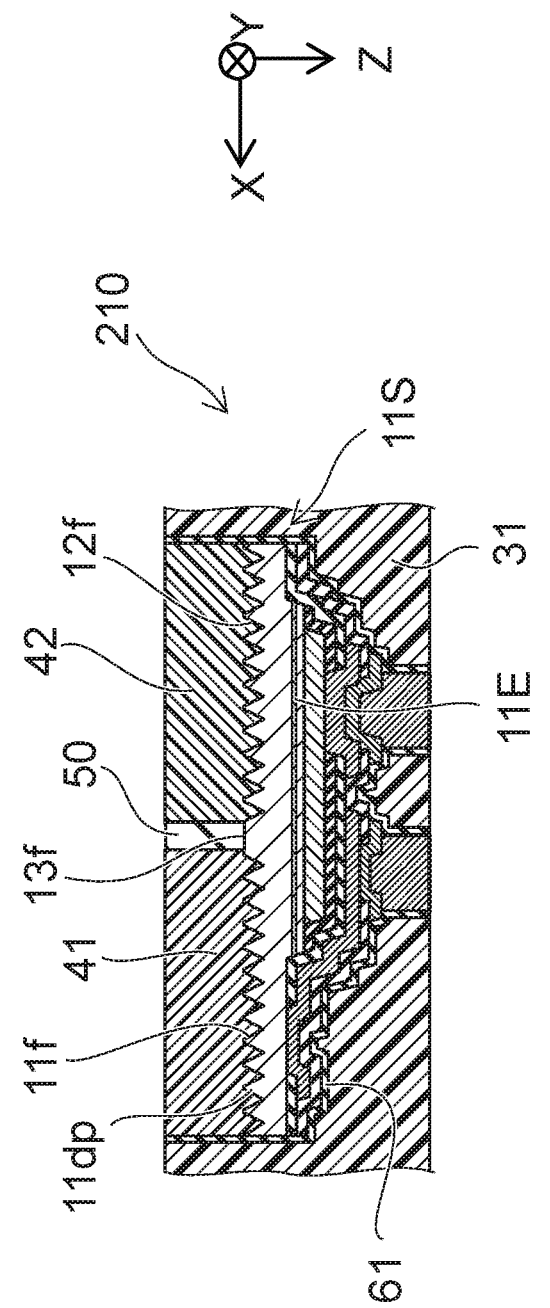
FIG. 13 is a schematic cross-sectional view showing the illustrative method of manufacturing a light-emitting device according to the first embodiment.
Figure 14:
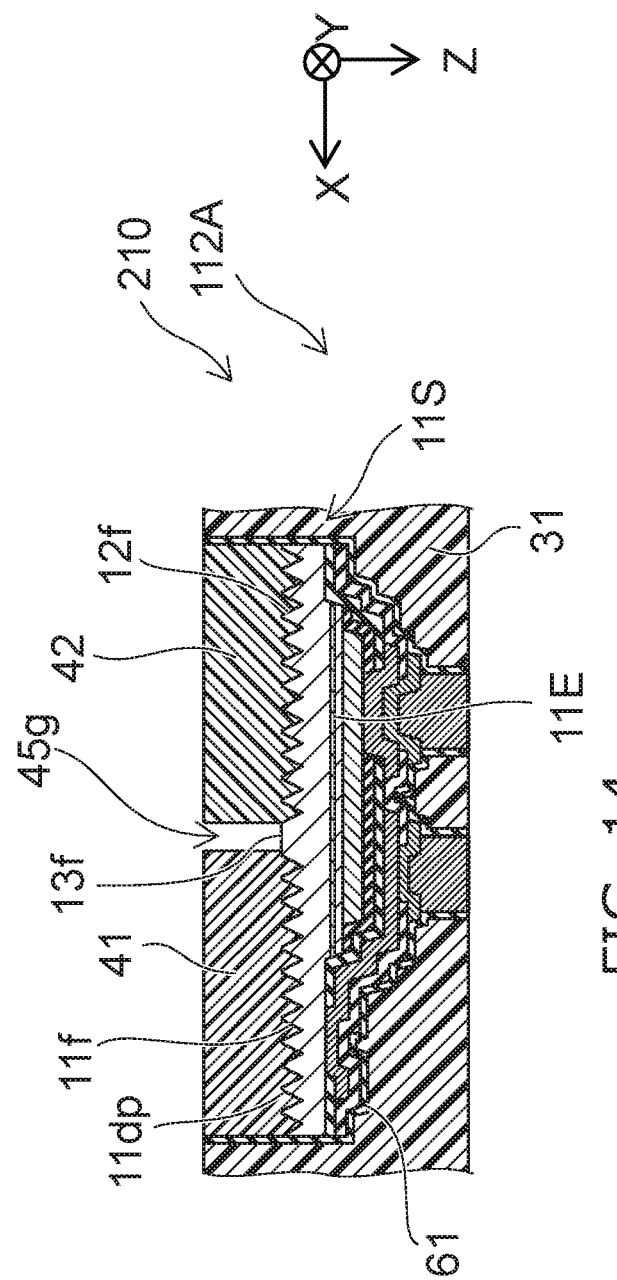
FIG. 14 is a schematic cross-sectional view showing the illustrative method of manufacturing a light-emitting device according to the first embodiment.
Figure 15:
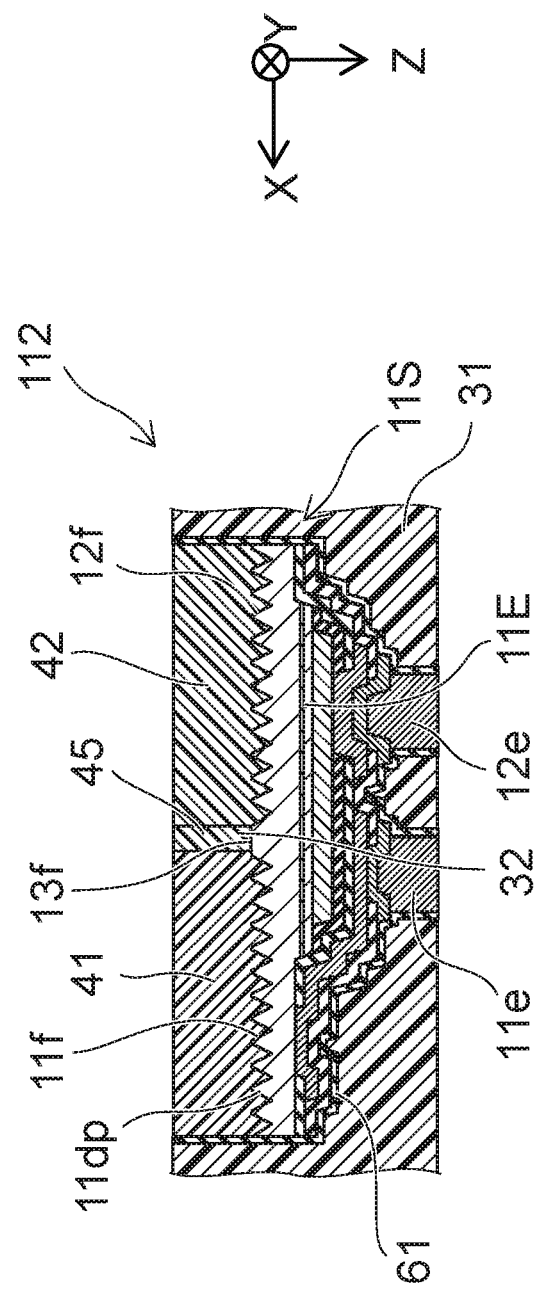
FIG. 15 is a schematic cross-sectional view showing the illustrative method of manufacturing a light-emitting device according to the first embodiment.

FIG. 13 to FIG. 15 are schematic cross-sectional views showing the illustrative method of manufacturing a light-emitting device according to the first embodiment.

The method of manufacturing a light-emitting device according to the present embodiment includes Steps S155 and S160 as shown in FIG. 12 in addition to Steps S110, S105, S106, S120, S121, S130, S135, S140, and S150 described referring to FIG. 1.

In Step S140, the first wavelength conversion member 41 is formed as shown in FIG. 13. In this example, the second wavelength conversion member 42 is formed in Step S150.

In Step S155, the third portion 50c of the silicon substrate 50 is removed after the step (Step S140) of forming the first wavelength conversion member 41 as shown in FIG. 14. In this example, the third portion 50c of the silicon substrate 50 is removed in Step S155 after the step (Step S150) of forming the second wavelength conversion member 42.

In Step S160, the second resin layer 32 is formed on the third surface 11c exposed by removing the third portion 50c as shown in FIG. 15.

For example, the light reflectance of the second resin layer 32 is higher than the light reflectance of the silicon substrate 50. The light transmittance of the second resin layer 32 is higher than the light transmittance of the silicon substrate 50. The second resin layer 32 protects the third surface 11c.

With the first wavelength conversion member 41 and the second wavelength conversion member 42 disposed along the X-axis direction in the first embodiment, a light-emitting device in which loss of light emitted from the first light-emitting layer 11E have been reduced, compared with the case in which the first wavelength conversion member 41 and the second wavelength conversion member 42 are disposed along the Z-axis direction, and its manufacturing method can be provided.

Second Embodiment

Figure 16:
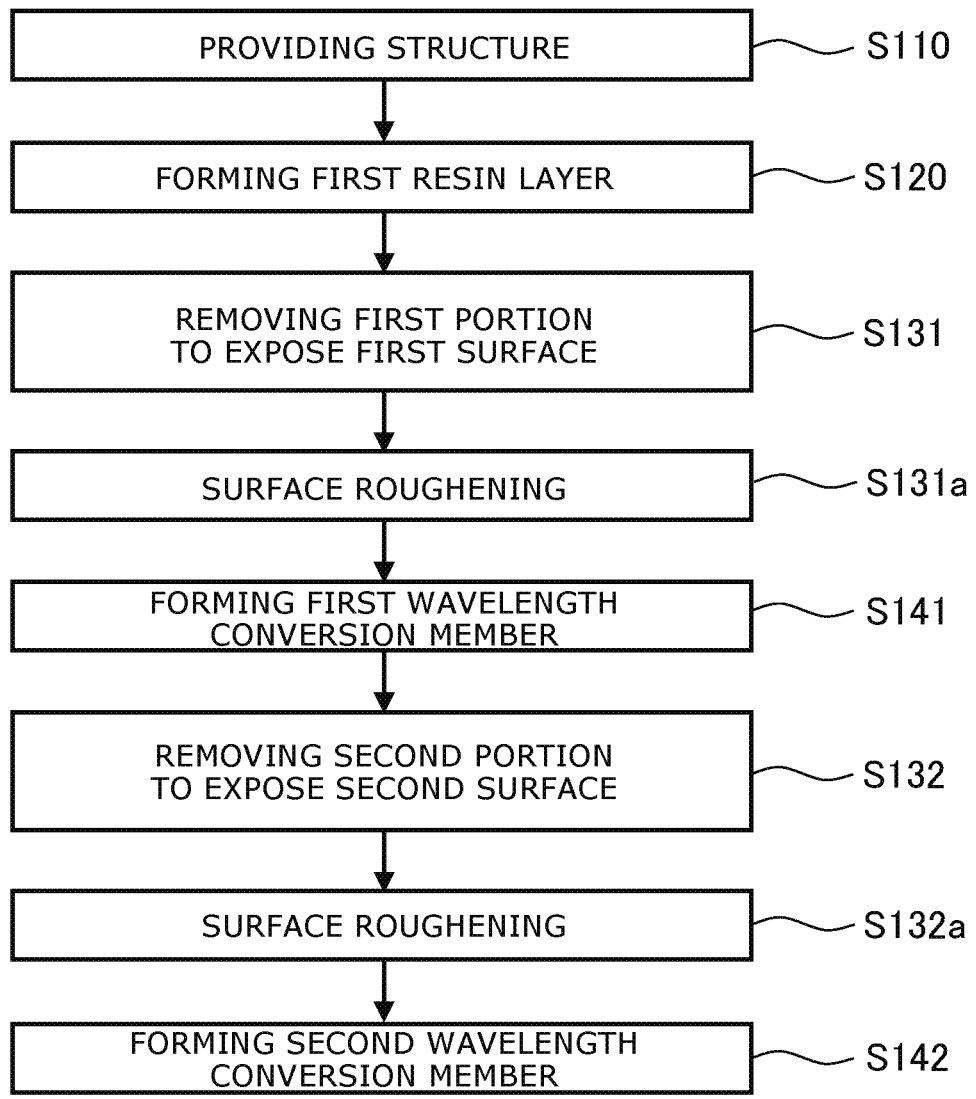
FIG. 16 is a flowchart of an illustrative method of manufacturing a light-emitting device according to a second embodiment.

FIG. 16 is a flowchart of an illustrative method of manufacturing a light-emitting device according to a second embodiment.

FIG. 17 to FIG. 21 are schematic cross-sectional views showing the illustrative method of manufacturing a light-emitting device according to the second embodiment.

Figure 17:
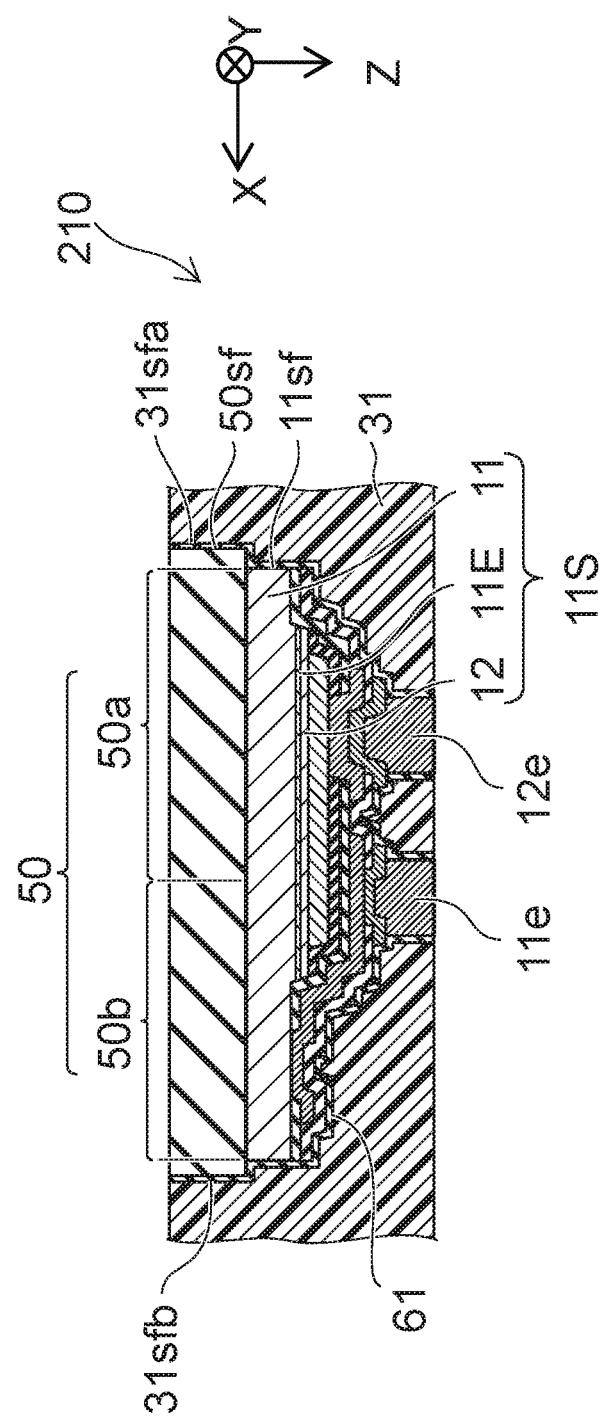
FIG. 17 is a schematic cross-sectional view showing the illustrative method of manufacturing a light-emitting device according to the second embodiment.

The structure body 210 is provided (Step S110) as shown in FIG. 16 and FIG. 17. The structure body 210 includes the silicon substrate 50 and the first semiconductor layered body 11S as shown in FIG. 17.

The silicon substrate 50 includes the first portion 50a and the second portion 50b. The first semiconductor layered body 11S is disposed on the silicon substrate 50.

The first semiconductor layered body 11S includes the first light-emitting layer 11E. In this example, the first semiconductor layered body 11S includes the first semiconductor layer 11 and the second semiconductor layer 12. The first light-emitting layer 11E is located between the first semiconductor layer 11 and the second semiconductor layer 12.

The direction from the silicon substrate 50 to the first semiconductor layered body 11S is referred to as Z-axis direction. A direction perpendicular to the Z-axis direction is referred to as X-axis direction. The direction perpendicular to the Z-axis direction and the X-axis direction is referred to as Y-axis direction. The direction from the first portion 50a to the second portion 50b lies along, for example, the X-axis direction.

The first resin layer 31 is formed (Step S120) as shown in FIG. 16 and FIG. 17. The first resin layer 31 covers lateral sides of the silicon substrate 50 and the first semiconductor layered body 11S. For example, in the X-axis direction, at least a portion of the silicon substrate 50 and the first semiconductor layered body 11S are located between a portion of the first resin layer 31 and another portion of the first resin layer 31.

For example, the first resin layer 31 has a lateral surface 31sfa and a lateral surface 31sfb. The lateral surface 31sfa and the lateral surface 31sfb of the first resin layer 31 intersect with the X-Y plane. At least a portion of the silicon substrate 50 and the first semiconductor layered body 11S are located between the lateral surface 31sfa and the lateral surface 31sfb of the first resin layer 31. Each of the lateral surface 31sfa and the lateral surface 31sfb faces the lateral surface 50sf of the silicon substrate 50 and the lateral surface 11sf of the first semiconductor layered body 11S. The lateral surface 31sfa and the lateral surface 31sfb may be inclined with respect to the Z-axis direction.

The first electrically-conductive member 11e and the second electrically-conductive member 12e are disposed as shown in FIG. 17. The first electrically-conductive member 11e is electrically connected to, for example, the first semiconductor layer 11. The second electrically-conductive member 12e is electrically connected to, for example, the second semiconductor layer 12. A portion of the first electrically-conductive member 11e and a portion of the second electrically-conductive member 12e are not covered with the first resin layer 31.

Figure 18:
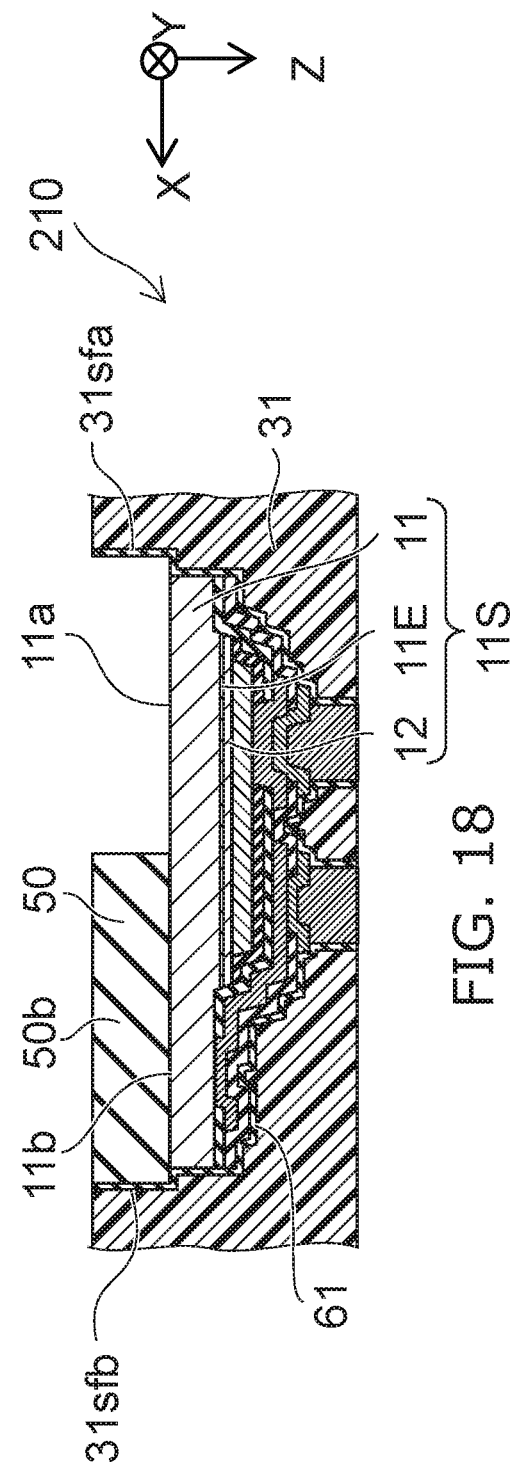
FIG. 18 is a schematic cross-sectional view showing the illustrative method of manufacturing a light-emitting device according to the second embodiment.

The first portion 50a of the silicon substrate 50 is removed (Step S131) as shown in FIG. 16 and FIG. 18. The first surface 11a of the first semiconductor layered body 11S is thus exposed.

The first surface 11a may be roughened (Step S131a) as shown in FIG. 16. By roughening the first surface 11a, the surface roughness of the first surface 11a is increased, and the irregularities 11dp are formed on the first surface 11a as shown in FIG. 19.

Figure 19:
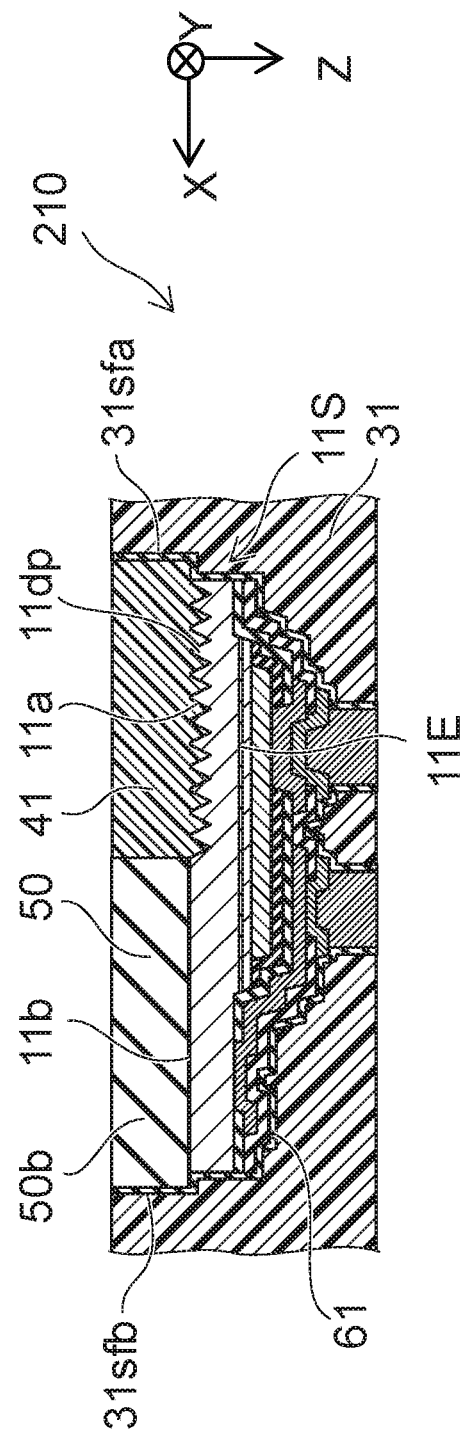
FIG. 19 is a schematic cross-sectional view showing the illustrative method of manufacturing a light-emitting device according to the second embodiment.

The first wavelength conversion member 41 is formed (Step S141) on the first surface 11a of the first semiconductor layered body 11S exposed by removing the first portion 50a as shown in FIG. 16 and FIG. 19.

Figure 20:
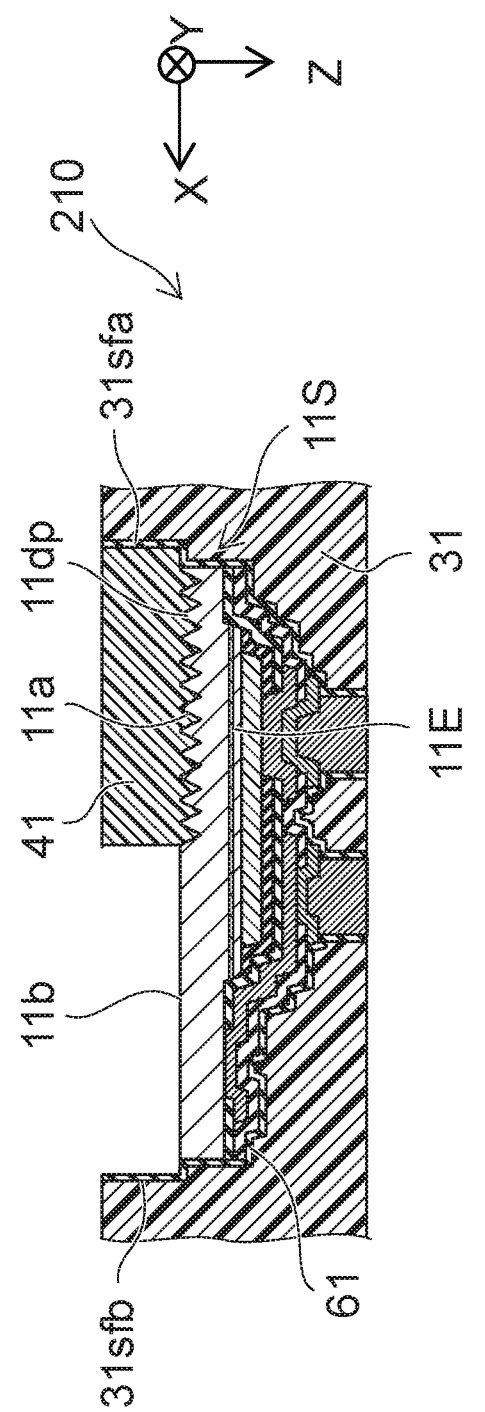
FIG. 20 is a schematic cross-sectional view showing the illustrative method of manufacturing a light-emitting device according to the second embodiment.

The second portion 50b is removed (Step S132) as shown in FIG. 16 and FIG. 20 after the step (Step S141) of forming the first wavelength conversion member 41. The second surface 11b of the first semiconductor layered body 11S is exposed by removing the second portion 50b.

As described above, the silicon substrate 50 is removed in the manufacturing method according to the present embodiment. This allows for reducing absorption of light by the silicon substrate 50. A method of manufacturing a light-emitting device and a light-emitting device in which loss of light can be reduced are provided.

The second surface 11b may be roughened (Step S132a) as shown in FIG. 16. By roughening the second surface 11b, the surface roughness of the second surface 11b is increased, and irregularities 11dq are formed on the second surface 11b.

Figure 21:
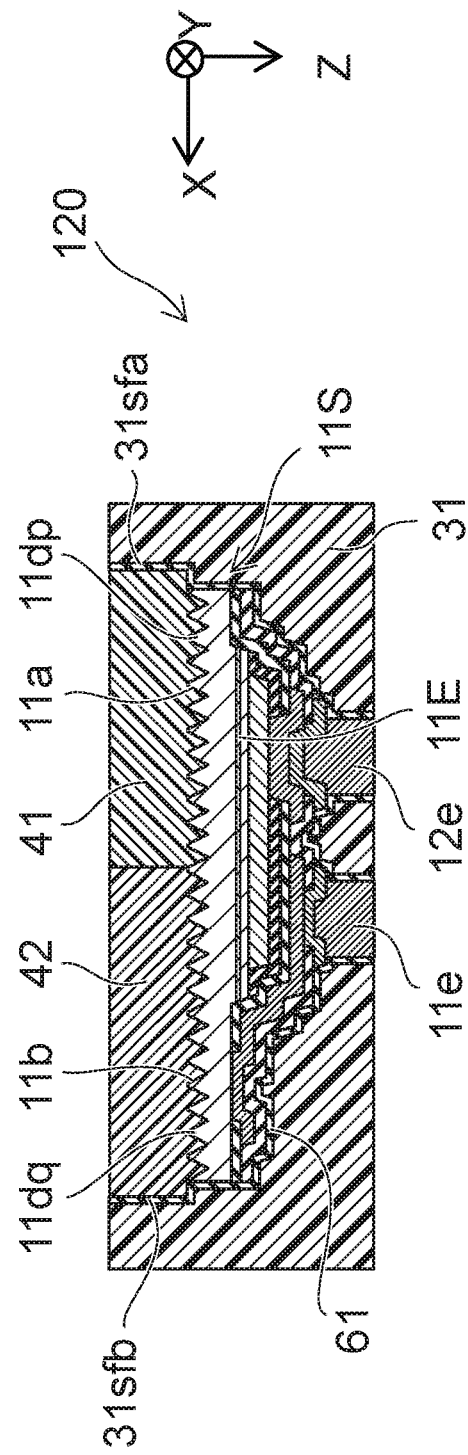
FIG. 21 is a schematic cross-sectional view showing the illustrative method of manufacturing a light-emitting device according to the second embodiment.

The second wavelength conversion member 42 is formed on the second surface 11b (Step S142) as shown in FIG. 16 and FIG. 21. A light-emitting device 120 is thus obtained.

For example, the peak wavelength of light emitted from the second wavelength conversion member 42 differs from the peak wavelength of light emitted from the first wavelength conversion member 41. For example, the second wavelength conversion member 42 is in contact with the first wavelength conversion member 41.

By the above method, the first wavelength conversion member 41 and the second wavelength conversion member 42 can be precisely formed. Further, a light-emitting device can be provided in which loss of light can be reduced compared with the case in which the first wavelength conversion member 41 and the second wavelength conversion member 42 are disposed along the Z-axis direction. With the first wavelength conversion member 41 and the second wavelength conversion member 42 being in contact with each other, a light-emitting device with good color mixing performance can be provided.

In the above example, the first surface 11a is roughened (Step S131a) between the step (Step S131) of exposing the first surface 11a and the step (Step S141) of forming the first wavelength conversion member 41. This allows high light extraction efficiency to be obtained.

In the above example, the second surface 11b is roughened (Step S132a) between the step (Step S132) of exposing the second surface 11b and the step (Step S142) of forming the second wavelength conversion member 42. This allows high light extraction efficiency to be obtained.

Third Embodiment

A third embodiment relates to a light-emitting device. The light-emitting device 110 shown in FIG. 6 will be described.

The light-emitting device 110 includes a semiconductor layered body (such as the first semiconductor layered body 11S), the first wavelength conversion member 41, the second wavelength conversion member 42, and a resin layer (such as the first resin layer 31) as shown in FIG. 6.

The first semiconductor layered body 11S includes a light-emitting layer (such as the first light-emitting layer 11E). A surface 11Sf of the semiconductor layered body 11S includes the first surface 11a, the second surface 11b, and the third surface 11c. The third surface 11c is located between the first surface 11a and the second surface 11b. The direction from the second surface 11b to the first surface 11a is, for example, the X-axis direction. The position of the third surface 11c in the X-axis direction is located between the position of the first surface 11a in the X-axis direction and the position of the second surface 11b in the X-axis direction.

The first wavelength conversion member 41 is disposed on the first surface 11a. The first wavelength conversion member 41 can emit light with a first peak wavelength.

The second wavelength conversion member 42 is disposed on the second surface 11b. The second wavelength conversion member 42 can emit light with a second peak wavelength different from the first peak wavelength.

The first resin layer 31 covers a lateral side of the semiconductor layered body 11S, a lateral side of the first wavelength conversion member 41, and a lateral side of the second wavelength conversion member 42. For example, in a direction (such as the X-axis direction) along the X-Y plane, the semiconductor layered body 11S, the first wavelength conversion member 41, and the second wavelength conversion member 42 are located between a portion of the first resin layer 31 and another portion of the first resin layer 31.

The surface roughness of the third surface 11c is less than the surface roughness of the first surface 11a and less than the surface roughness of the second surface 11b as shown in FIG. 6.

With the surface roughness of the first surface 11a being large, light emitted from the first semiconductor layered body 11S efficiently enters the first wavelength conversion member 41. With the surface roughness of the second surface 11b being large, light emitted from the first semiconductor layered body 11S efficiently enters the second wavelength conversion member 42. Accordingly high light extraction efficiency can be obtained.

In the example shown in FIG. 6, there is the third portion 50c of the silicon substrate 50 on the third surface 11c. As the surface roughness of the third surface 11c is low, light emitted from the first semiconductor layered body 11S is reflected at the third surface 11c and is unlikely to enter the third portion 50c. Accordingly absorption of light in the third portion 50d can be reduced.

The present embodiment allow for providing a light-emitting device in which loss of light can be reduced.

An intermediate layer 45 can be deemed to be disposed on the third surface 11c as shown in FIG. 6. In this example, the intermediate layer 45 contains silicon (the silicon substrate 50).

The intermediate layer 45 may contain resin (the second resin layer 32) as in a light-emitting device 112 shown in FIG. 15. The intermediate layer 45 may contain at least one selected from the group consisting of resin and silicon as described above. In the case in which the intermediate layer 45 is made of silicon, a portion of the silicon substrate can be used as the intermediate layer 45, and the manufacturing process can be reduced. In the case in which the intermediate layer 45 is made of a light-reflective resin, loss of light is reduced compared with the case in which, for example, the intermediate layer 45 is made of silicon. In the case in which the intermediate layer 45 is made of a light-transmissive resin, loss of light is reduced compared with the case in which, for example, the intermediate layer 45 is made of silicon or a light-reflective resin.

In the example shown in FIG. 14, the third portion 50c of the silicon substrate 50 is removed after the step (Step S140) of forming the first wavelength conversion member 41. After that, the intermediate layer 45 may not be formed in the region (space) formed by removing the third portion 50c. A light-emitting device 112A is thus obtained. In this case, at least a portion of the region between the first wavelength conversion member 41 and the second wavelength conversion member 42 is an empty space 45g as shown in FIG. 14.

The difference in refractive index between air and the wavelength conversion members is larger than the difference in refractive index between the light-transmissive resin and the wavelength conversion members. Accordingly, in the case in which at least a portion of the region between the first wavelength conversion member 41 and the second wavelength conversion member 42 is the empty space 45g, for example, light that has passed through one of the wavelength conversion members is prevented from entering the other wavelength conversion member compared with the case in which a light-transmissive resin constitutes at least a portion of the region between the first wavelength conversion member 41 and the second wavelength conversion member 42.

For example, the first wavelength conversion member 41 and the second wavelength conversion member 42 are in contact with each other in the light-emitting device 120 shown in FIG. 21, so that good color mixing performance can be obtained.

Some examples of the light-emitting device according to the third embodiment will be described.

Figure 22:
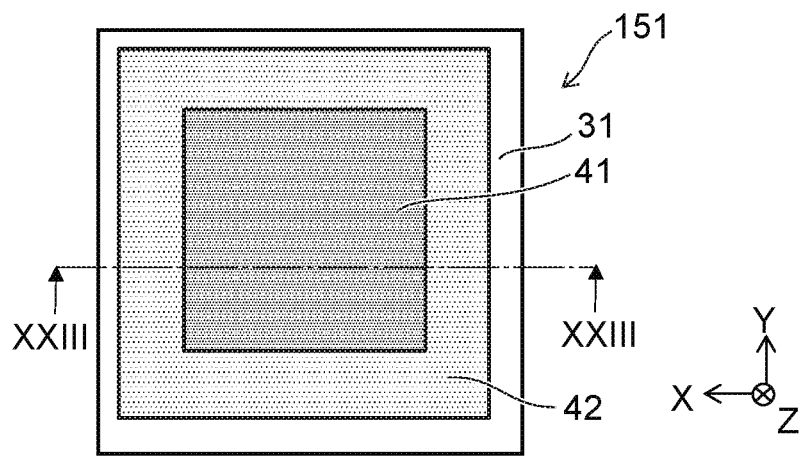
FIG. 22 is a schematic plan view of an illustrative light-emitting device according to a third embodiment.

FIG. 22 is a schematic plan view of an illustrative light-emitting device according to the third embodiment.

Figure 23:
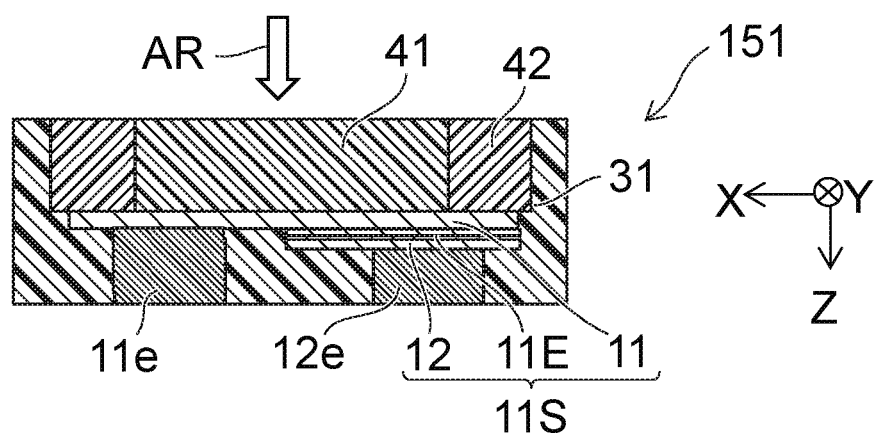
FIG. 23 is a schematic cross-sectional view of the illustrative light-emitting device according to the third embodiment.

FIG. 23 is a schematic cross-sectional view of the illustrative light-emitting device according to the third embodiment.

FIG. 22 is a schematic plan view taken from the direction of the arrow AR in FIG. 23. FIG. 23 is a schematic cross-sectional view taken along the line XXIII-XXIII of FIG. 22.

In a light-emitting device 151, the second wavelength conversion member 42 is disposed around the first wavelength conversion member 41 in the X-Y plane as shown in FIG. 22 and FIG. 23. In an example, the first wavelength conversion member 41 and the second wavelength conversion member 42 contain a yellow phosphor. For example, the phosphor concentration in the first wavelength conversion member 41 is higher than the phosphor concentration in the second wavelength conversion member 42.

For example, light emitted from the light-emitting device 151 upward (in a direction along the Z-axis direction in FIG. 23) is yellower than light emitted upward in the case in which the wavelength conversion members have the same phosphor concentration. For example, light emitted from the light-emitting device 151 laterally (in a direction along the X-Y plane in FIG. 23) is bluer than light emitted laterally in the case in which the wavelength conversion members have the same phosphor concentration. Color unevenness in the light distribution of the light-emitting device 151 is reduced.

Each of FIG. 24 to FIG. 29 is a schematic plan view of an illustrative light-emitting device according to the third embodiment.

Figure 24:
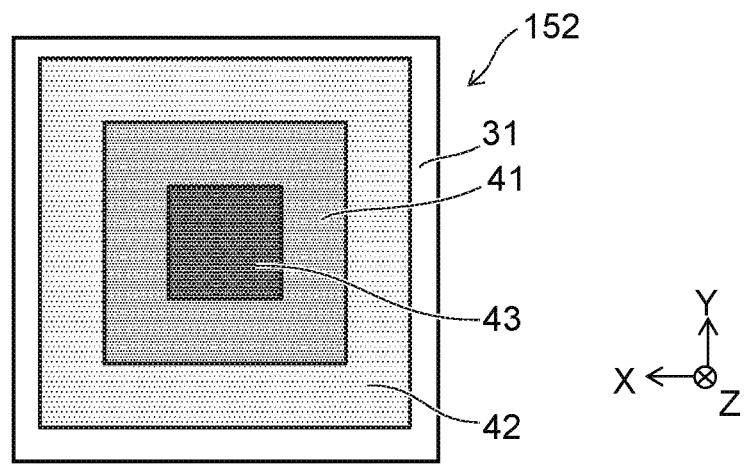
FIG. 24 is a schematic plan view of an illustrative light-emitting device according to the third embodiment.

A third wavelength conversion member 43 may be disposed in addition to the first wavelength conversion member 41 and the second wavelength conversion member 42 as in a light-emitting device 152 shown in FIG. 24. The first wavelength conversion member 41, the second wavelength conversion member 42, and the third wavelength conversion member 43 can have any shapes. The first wavelength conversion member 41, the second wavelength conversion member 42, and the third wavelength conversion member 43 can be located at any positions.

Figure 25:
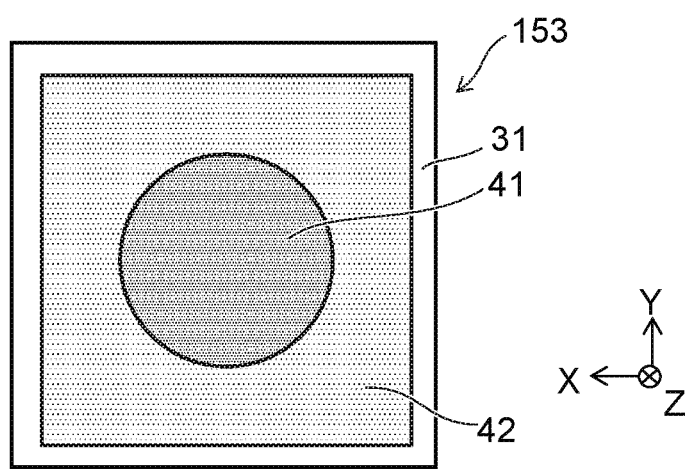
FIG. 25 is a schematic plan view of an illustrative light-emitting device according to the third embodiment.
Figure 26:
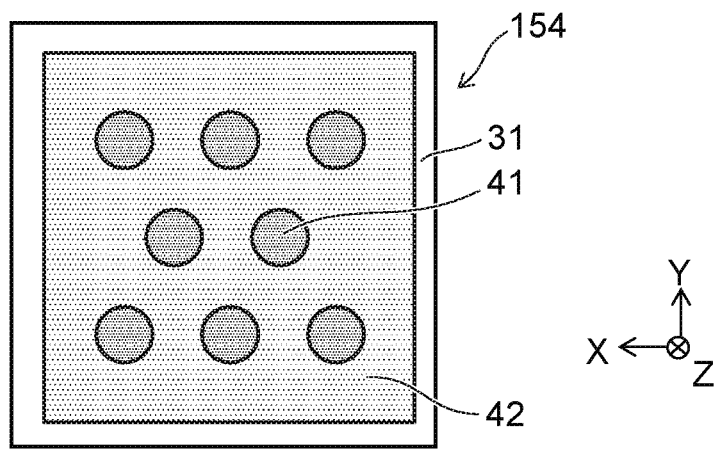
FIG. 26 is a schematic plan view of an illustrative light-emitting device according to the third embodiment.
Figure 27:
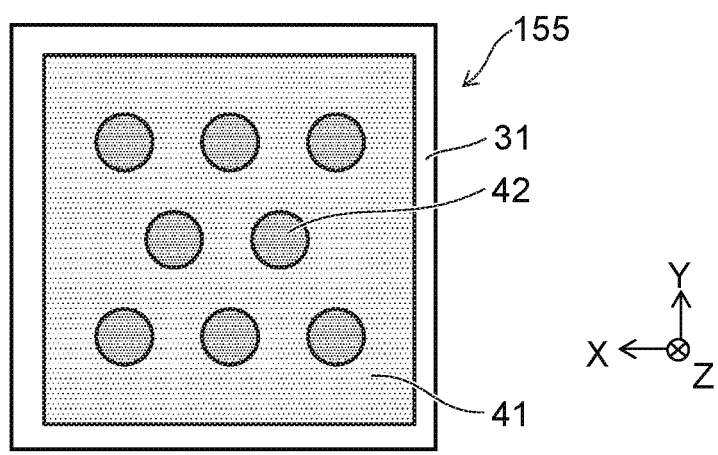
FIG. 27 is a schematic plan view of an illustrative light-emitting device according to the third embodiment.
Figure 28:
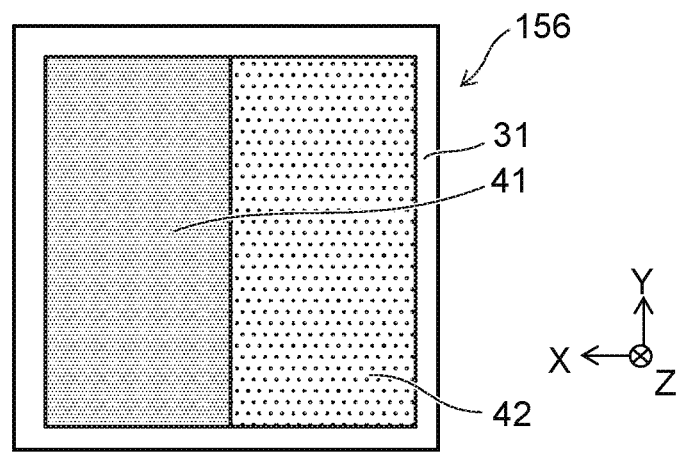
FIG. 28 is a schematic plan view of an illustrative light-emitting device according to the third embodiment.

The first wavelength conversion member may have a circular shape in a plan view as in a light-emitting device 153 shown in FIG. 25. A plurality of first wavelength conversion members 41 may be disposed as in a light-emitting device 154 shown in FIG. 26. A plurality of second wavelength conversion members 42 may be disposed as in a light-emitting device 155 shown in FIG. 27. The number of the first wavelength conversion members 41 and the number of the second wavelength conversion members 42 may be both one as in a light-emitting device 156 shown in FIG. 28.

Figure 29:
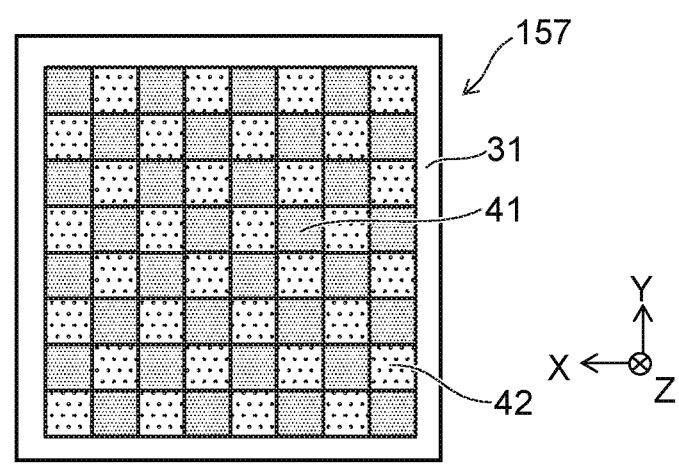
FIG. 29 is a schematic plan view of an illustrative light-emitting device according to the third embodiment.

A plurality of first wavelength conversion members 41 and a plurality of second wavelength conversion members 42 may be disposed as in a light-emitting device 157 shown in FIG. 29. One of the first wavelength conversion members 41 is located between one of the second wavelength conversion members 42 and another one of the second wavelength conversion members 42. One of the second wavelength conversion members 42 is located between one of the first wavelength conversion members 41 and another one of the first wavelength conversion members 41. The first wavelength conversion members 41 and the second wavelength conversion members 42 are aligned in the X-axis direction. The first wavelength conversion members 41 and the second wavelength conversion members 42 are aligned in the Y-axis direction. The first wavelength conversion members 41 and the second wavelength conversion members 42 can be aligned in any direction. The light-emitting device 157 tends to provide high color mixing performance.

Certain embodiments allow for providing a method of manufacturing a light-emitting device and a light-emitting device in which loss of light can be reduced.

In the specification of the present application, the expressions "perpendicular" and "parallel" refer to not only a strictly perpendicular configuration and a strictly parallel configuration, but also accept, for example, variations caused by the manufacturing process. Substantially perpendicular configurations and substantially parallel configurations are sufficient.

Certain embodiments of the present invention have been described above referring to specific examples. However, the present invention is not limited to these specific examples. For example, specific structures of the semiconductor layers, the light-emitting layers, the electrically-conductive members, the resin layers, the light-reflecting films, and the wavelength conversion members included in the light-emitting device may be appropriately selected from those known in the art by a person skilled in the art, and variations of such specific configurations are within the scope of the present invention as long as a person skilled in the art can implement the present invention in a similar manner and can obtain similar effects.

A combination of two or more elements in the specific examples made within the range of technical possibility also falls within the scope of the present invention as long as the combination involves the gist of the present invention.

Further, all methods for manufacturing a light-emitting device and all light-emitting devices that can be made through appropriate changes in design made by a person skilled in the art on the basis of the methods for manufacturing a light-emitting device and the light-emitting devices described above in certain embodiments of the present invention fall within the scope of the present invention as long as the gist of the present invention is involved.

Still further, a person skilled in the art can think of various variations and modifications within the idea of the present invention. Therefore, those variations and modifications also fall within the scope of the present invention.

The invention claimed is:

1. A method of manufacturing a light-emitting device, the method comprising:
   providing a structure body comprising:
      a silicon substrate,
      a first semiconductor layered body comprising a first light-emitting layer, the first semiconductor layered body being disposed on or above the silicon substrate, and a second semiconductor layered body comprising a second light-emitting layer, the second semiconductor layered body being disposed on or above the silicon substrate;

removing an upper-side portion of the silicon substrate from an upper side of the silicon substrate, wherein the upper-side portion is located between the first semiconductor layered body and the second semiconductor layered body in a first direction from the first semiconductor layered body to the second semiconductor layered body;

after the step of removing the upper-side portion, forming a light-reflecting film over lateral surfaces of the silicon substrate formed in the step of removing the upper-side portion;

after the step of forming the light-reflecting film, forming a first resin layer comprising a lateral portion covering a lateral side of the silicon substrate and lateral sides of the first and second semiconductor layered bodies, such that a portion of the first resin layer is in a region formed in the step of removing the upper-side portion;

removing (i) a first portion of the silicon substrate to expose a first surface of the first semiconductor layered body, (ii) a second portion of the silicon substrate to expose a second surface of the first semiconductor layered body, and (iii) an intermediate portion of the silicon substrate below the lateral portion of the first resin layer, and leaving a third portion of the silicon substrate on a third surface of the first semiconductor layered body that is between the first surface and the second surface, wherein the third surface is continuous with the first surface and the second surface, and wherein removing the intermediate portion causes the light-reflecting film to be exposed; and forming a first wavelength conversion member on or below the first surface exposed by the removal of the first portion.

2. The method of manufacturing a light-emitting device according to claim 1, further comprising:
forming a second wavelength conversion member on or below the second surface formed by the removal of the second portion,
wherein a peak wavelength of light emitted from the second wavelength conversion member differs from a peak wavelength of light emitted from the first wavelength conversion member.

3. The method of manufacturing a light-emitting device according to claim 2, further comprising:
after the step of forming the first wavelength conversion member, removing the third portion.

4. The method of manufacturing a light-emitting device according to claim 3, further comprising:
forming a second resin layer on or below the third surface exposed by the removal of the third portion.

5. The method of manufacturing a light-emitting device according to claim 4, wherein:
a light reflectance of the second resin layer is higher than a light reflectance of the silicon substrate.

6. The method of manufacturing a light-emitting device according to claim 1, further comprising:
between the step of removing the first, second, and intermediate portions and the step of forming the first wavelength conversion member, roughening the first surface.

7. The method of manufacturing a light-emitting device according to claim 1, further comprising:
removing a portion of the first resin layer,
wherein the structure body further comprises a first electrically-conductive member electrically connected to the first semiconductor layered body, and
wherein the step of removing the portion of the first resin layer comprises exposing a portion of the first electrically-conductive member from the first resin layer.

8. The method of manufacturing a light-emitting device according to claim 1, wherein:
a distance in the first direction between two lateral surfaces of the silicon substrate formed in the step of removing the upper-side portion increases along a direction from the silicon substrate to the first semiconductor layered body, and
in the step of forming the first resin layer, a distance in the first direction between two lateral surfaces of the first resin layer formed in the region formed in the step of removing the upper-side portion increases along the direction from the silicon substrate to the first semiconductor layered body.

9. The method of manufacturing a light-emitting device according to claim 1, wherein removing the intermediate portion causes the first resin layer to be exposed.

* * * * *